(12) United States Patent
Regni et al.

(10) Patent No.: US 10,545,826 B2
(45) Date of Patent: Jan. 28, 2020

(54) LAYERED ERROR CORRECTION ENCODING FOR LARGE SCALE DISTRIBUTED OBJECT STORAGE SYSTEM

(71) Applicant: Scality S.A., Paris (FR)

(72) Inventors: Giorgio Regni, Albany, CA (US); Vianney Rancurel, San Francisco, CA (US); Lam Pham Sy, Issy-les-Moulineaux (FR)

(73) Assignee: Scality, S.A., Paris (FR)

(*) Notice: Subject to any disclaimer, the term of this patent is extended or adjusted under 35 U.S.C. 154(b) by 0 days.

(21) Appl. No.: 15/605,906

(22) Filed: May 25, 2017

(65) Prior Publication Data

US 2018/0341551 A1 Nov. 29, 2018

(51) Int. Cl.
| | |
|---|---|
| *G06F 11/00* | (2006.01) |
| *H03M 13/11* | (2006.01) |
| *H03M 13/00* | (2006.01) |
| *G06F 11/10* | (2006.01) |

(52) U.S. Cl.
CPC ......... *G06F 11/1096* (2013.01); *H03M 13/11* (2013.01); *H03M 13/616* (2013.01)

(58) Field of Classification Search
CPC . G06F 11/1096; H03M 13/11; H03M 13/616; G11C 29/52
See application file for complete search history.

(56) References Cited

U.S. PATENT DOCUMENTS

| | | | | |
|---|---|---|---|---|
| 8,832,363 | B1* | 9/2014 | Sundaram | G06F 11/108 |
| | | | | 711/103 |
| 9,201,733 | B2* | 12/2015 | Verma | G06F 11/1092 |
| 9,465,821 | B1* | 10/2016 | Patiejunas | G06F 17/30289 |
| 9,477,551 | B1 | 10/2016 | Piszczek et al. | |
| 9,524,302 | B2* | 12/2016 | Regni | G06F 16/284 |
| 2012/0216096 | A1 | 8/2012 | Seo et al. | |
| 2014/0289489 | A1 | 9/2014 | Takahashi | |
| 2015/0052354 | A1 | 2/2015 | Purohit | |

(Continued)

OTHER PUBLICATIONS

Starting on p. 1, paragraphs [0016 through paragraph [0030] only of the published patent application 2018/0341551 A1, filed May 25, 2017, pp. 1-2.

(Continued)

*Primary Examiner* — Phung M Chung
(74) *Attorney, Agent, or Firm* — Compass IP Law PC

(57) ABSTRACT

A method is described. The method includes fragmenting data of an object for storage into an object storage system into multiple data fragments and performing a first error correction encoding process on the data to generate one or more parity fragments for the object. The method also includes sending the multiple data fragments and the one or more parity fragments over a network to different storage servers of the object storage system. The method also includes performing the following at each of the different storage servers: i) incorporating the received one of the multiple data fragments and one or more parity fragments into an extent comprising multiple fragments of other objects; ii) performing a second error correction encoding process on multiple extents including the extent to generate parity information for the multiple extents; and, iii) storing the multiple extents and the parity information.

22 Claims, 17 Drawing Sheets

(56) References Cited

U.S. PATENT DOCUMENTS

| | | | |
|---|---|---|---|
| 2015/0205663 A1* | 7/2015 | Sundaram | G06F 11/108 714/6.24 |
| 2016/0077746 A1* | 3/2016 | Muth | G06F 3/0608 711/159 |
| 2016/0335158 A1 | 11/2016 | Schrijver et al. | |
| 2016/0350358 A1* | 12/2016 | Patel | G06F 17/30156 |

OTHER PUBLICATIONS

International Search Report and Written Opinion for PCT Patent Application No. PCT/US18/331840, dated Sep. 3, 2018, 12 pages.

* cited by examiner

401_2
403_2 server 401_1
attempts to recover
corrupted fragment's
lost data from
locally calculated and
stored parity
Information 408

401_1
403_1

LAYERED ERROR CORRECTION ENCODING FOR LARGE SCALE DISTRIBUTED OBJECT STORAGE SYSTEM

FIELD OF INVENTION

The field of invention pertains generally to the computing sciences and more specifically to layered error correction encoding for large scale distributed object storage system.

BACKGROUND

Large scale distributed storage systems are becoming increasingly popular with the emergence of cloud computing and other real time, network attached, highly functional applications. A matter of importance of such storage systems is the ability to guarantee the integrity of the data that is submitted to them for storage. As such, error correction encoding technology is an important feature of their viability.

FIGURES

A better understanding of the present invention can be obtained from the following detailed description in conjunction with the following drawings, in which:

FIGS. 4a, 4b and 4c show an improved encoding and recovery process;

Figure 1:
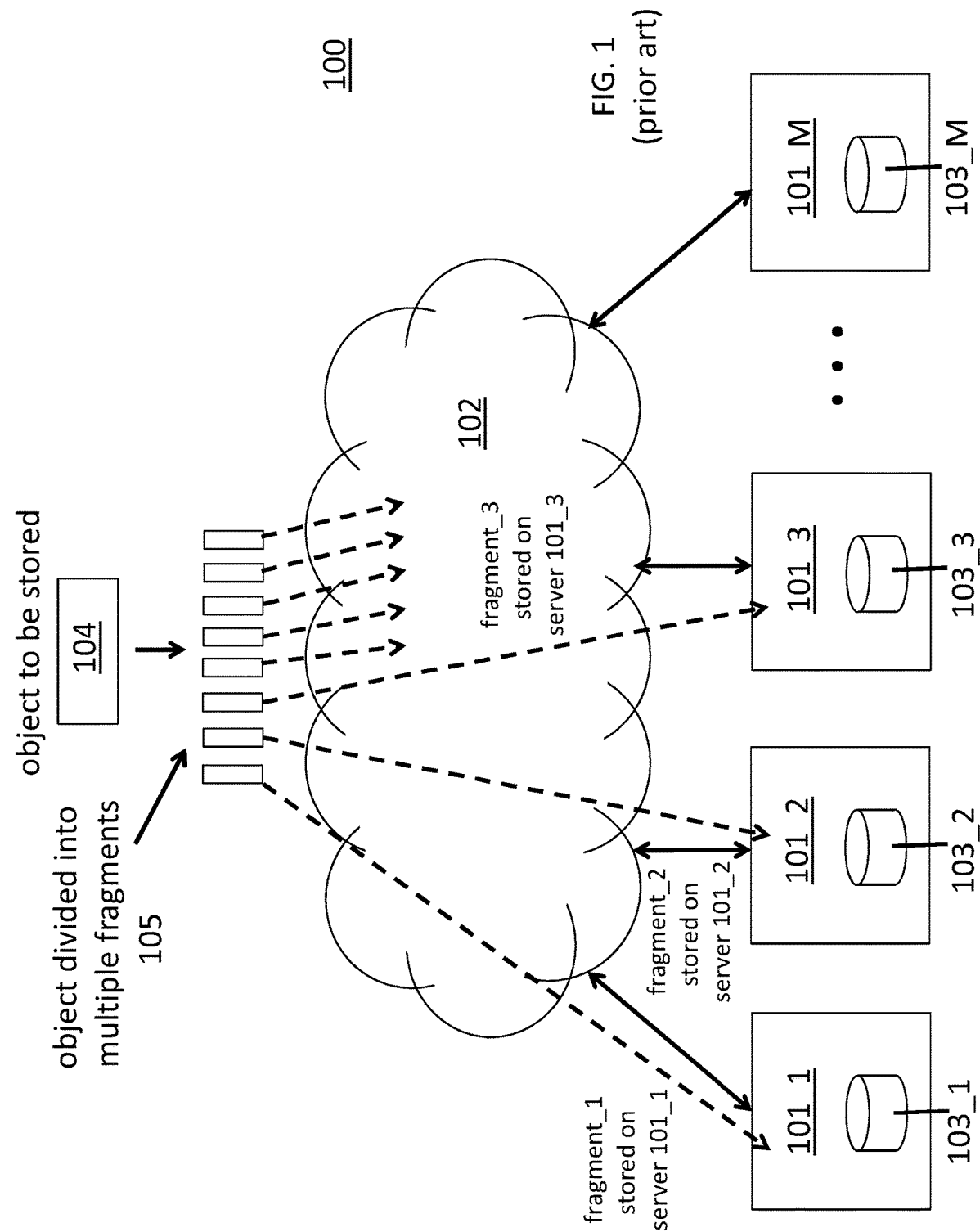
FIG. 1 (prior art) shows a first storage process.

DETAILED DESCRIPTION 1.0 State of the Art Data Protection Schemes for Large Scale Distributed Object Storage Systems An object storage system (also referred to as a "key/value" storage system) stores objects containing information where each object in the system is accessed for read/write operations by a respective object identifier that is assigned to the object and that uniquely identifies the object within the storage system. FIG. 1 shows a distributed object storage system 100 composed of multiple servers 101_1 through 101_M that are interconnected through a network 102. Here, each server includes multiple storage devices 103_1 through 103_M such as multiple magnetic storage disk drive devices and/or multiple solid state disk devices (for ease of drawing FIG. 1 actually depicts only one storage device per server).

An object 104 is stored in the object storage system by breaking the object down into multiple fragments 105 and sending the different fragments through the network 102 to be individually stored on different servers. For simplicity FIG. 1 suggests different fragments are directed to different servers in a sequential fashion but in fact more diverse schemes may be used (e.g., sending fragments to randomly different servers). Error correction coding (ECC) information, also referred to as parity information, is often appended to the object's information and stored in the system so that if some of the object's information is lost (e.g., from a hard disk drive crash) it can be reconstructed from the remaining, correct information that resides within the system.

Figure 2A:
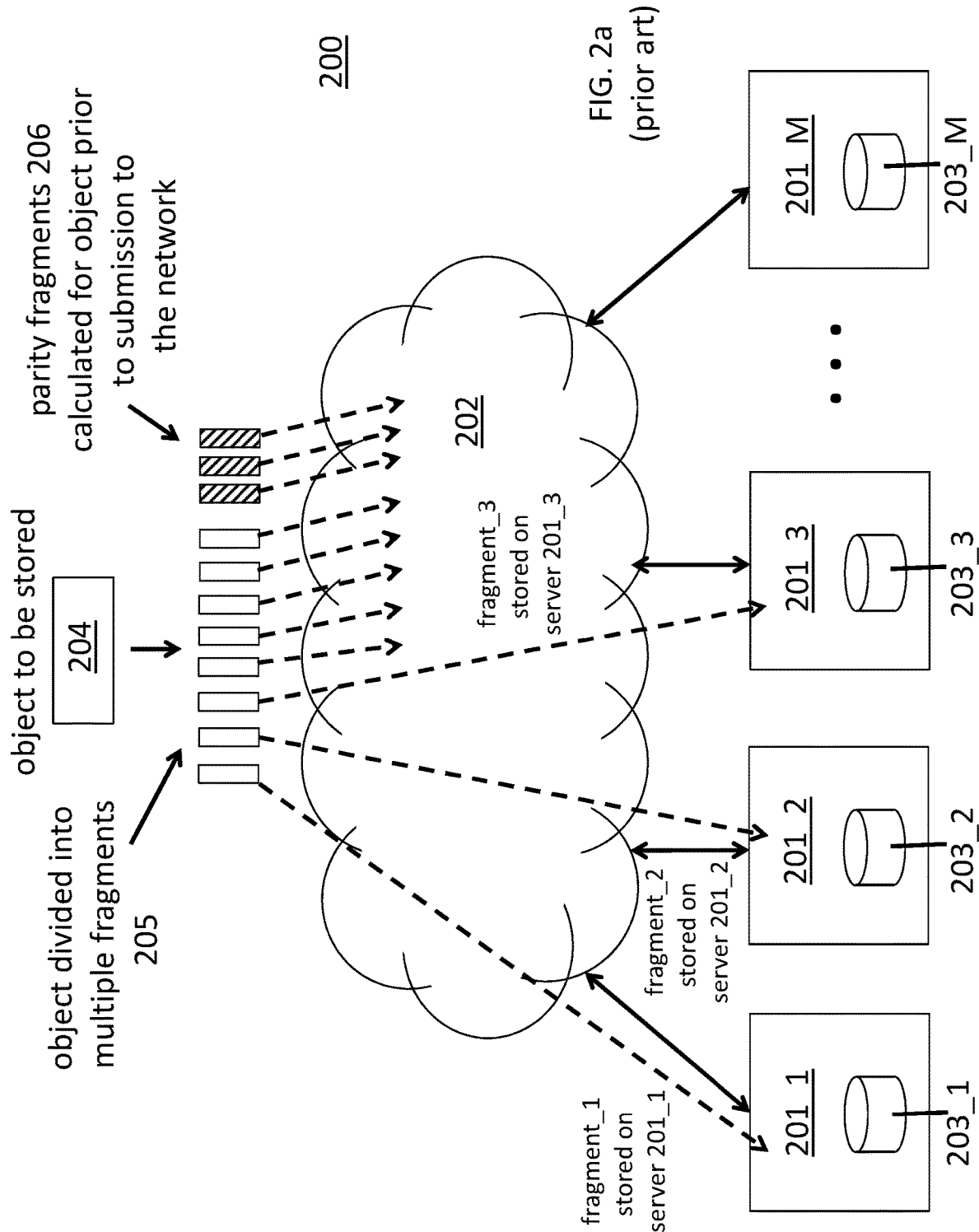
FIGS. 2a and 2b (prior art) show a first encoding and recovery process.
Figure 2B:
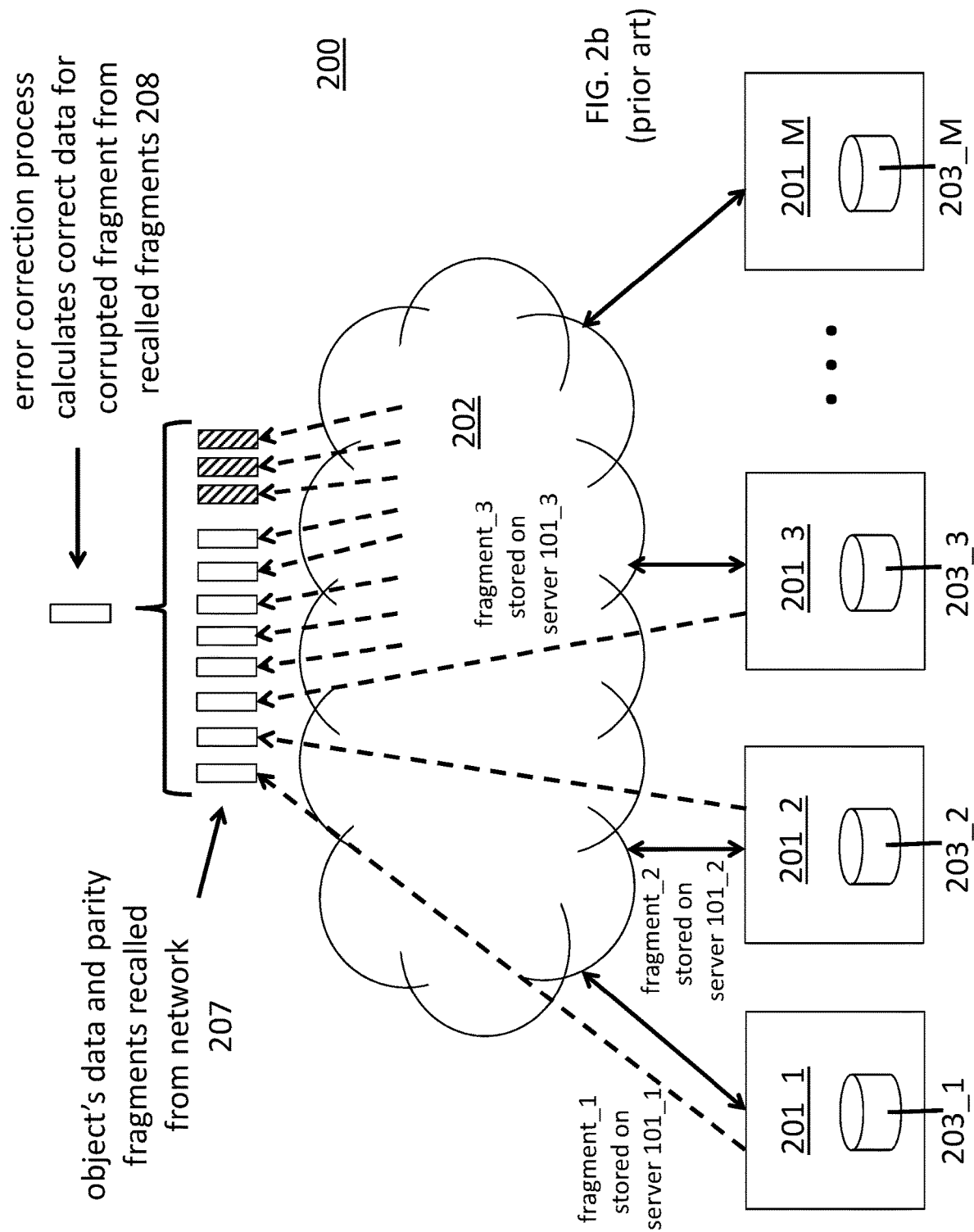

FIGS. 2a and 2b shows a first prior art approach for storing an object with appended parity information. According to the approach of FIG. 2, the parity information 206 is calculated prior to transportation of the object's fragments 205 over the network 202. Here, the object's "customer" data 204 can be viewed as being contained within data fragments 205. Error correction encoding calculations are performed on the object's data content 204 to create parity fragments 206.

According to various approaches, each of the different parity fragments (FIG. 2a shows three different parity fragments) is calculated according to different mathematical calculations over the object's data fragments 205 (e.g., the first parity fragment is determined according to a first mathematical calculation, the second parity fragment is calculated according to a second different mathematical calculation and the third parity fragment is calculated according to a third different mathematical calculation).

Thus, at the completion of the parity calculations, the total number of fragments for the object to be stored by the system 200 includes the data fragments 205 data and the parity fragments 206. The data fragments 205 and the parity fragments 206 are then transported over the network 202 and individually stored on different ones of the servers 201_1 through 201_M.

Referring to FIG. 2b, if the information from one of the fragments (either data or parity) becomes corrupted, e.g., due to a hard drive crash of the server that stored the corrupted fragment, the storage system 200 reads/recalls 207 the data and parity fragments that are stored for the object from their respective servers (the corrupted fragment may also be recalled). The data and parity fragments may be recalled, as suggested by FIG. 2b, to a different server or computer than the servers that store the object's data and parity fragments, or, may be recalled by one of the servers that stores one of the object's data and parity fragments (such as the server that stores the corrupted fragment and has recognized its corruption thereby triggering the read of the object's other fragments).

After the recalled data and parity fragments have been received, an error correction process processes the received fragments to calculate the lost content 208. With the lost content being recovered, a whole, correct replacement fragment is realized for the corrupted fragment. The replacement fragment can then be restored on a server within the system.

A problem with the data recovery approach of FIGS. 2a and 2b, however, is that the recalling of the remaining fragments over the network 202 in order to recover the lost content. Here, for example, if the fragments are particularly large and/or the object's information corresponds to the storage of a large number of fragments, a large amount of information needs to be transported over the network 202 in order to restore the corrupted content. With the network of many large scale object storage systems corresponding to a large, complex network dispersed, e.g., over a wide geographic area, the transportation of large amounts of information over the network 202 corresponds to a sizable inefficiency.

Figure 3A:
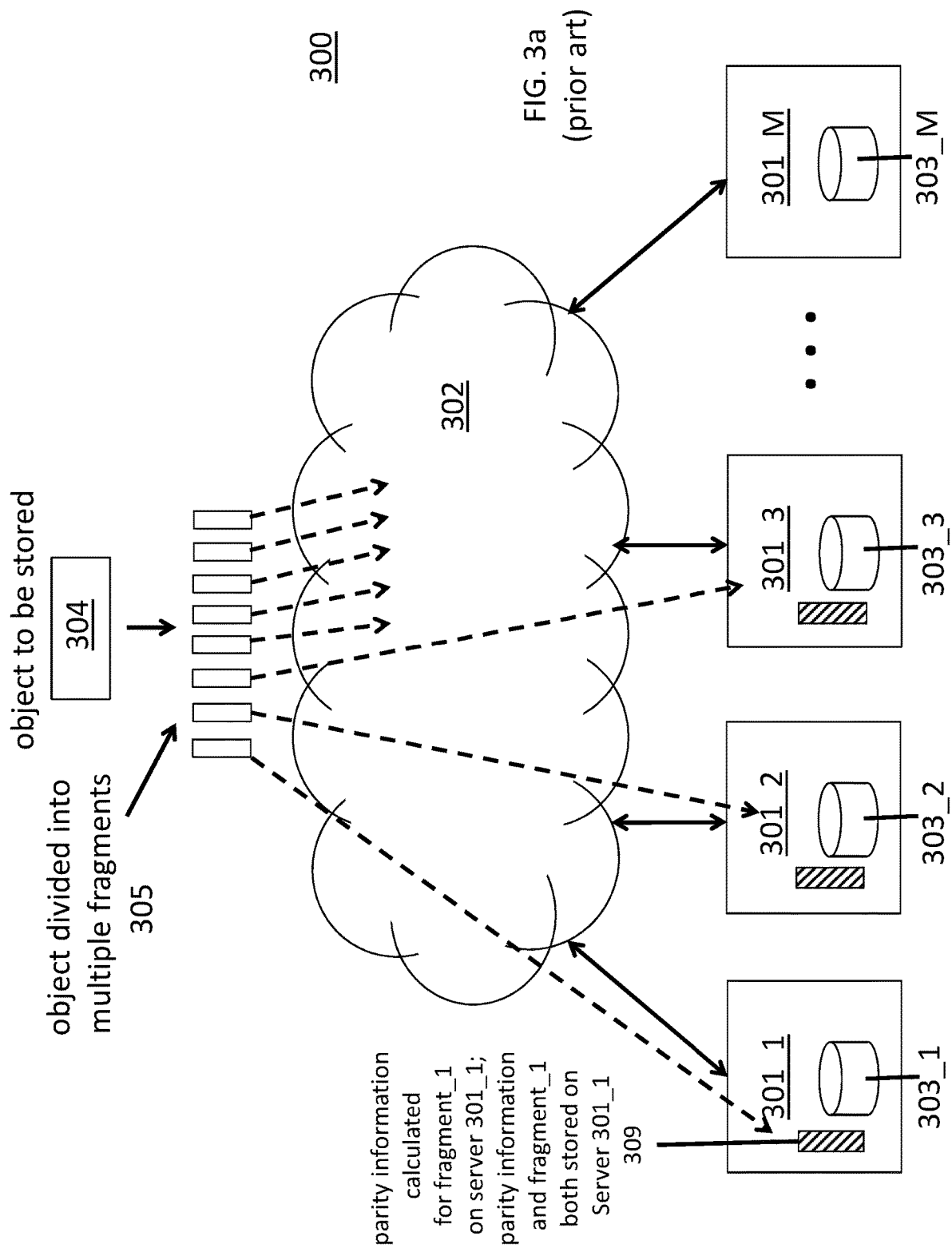
FIGS. 3a and 3b (prior art) show a second encoding and recovery process.
Figure 3B:
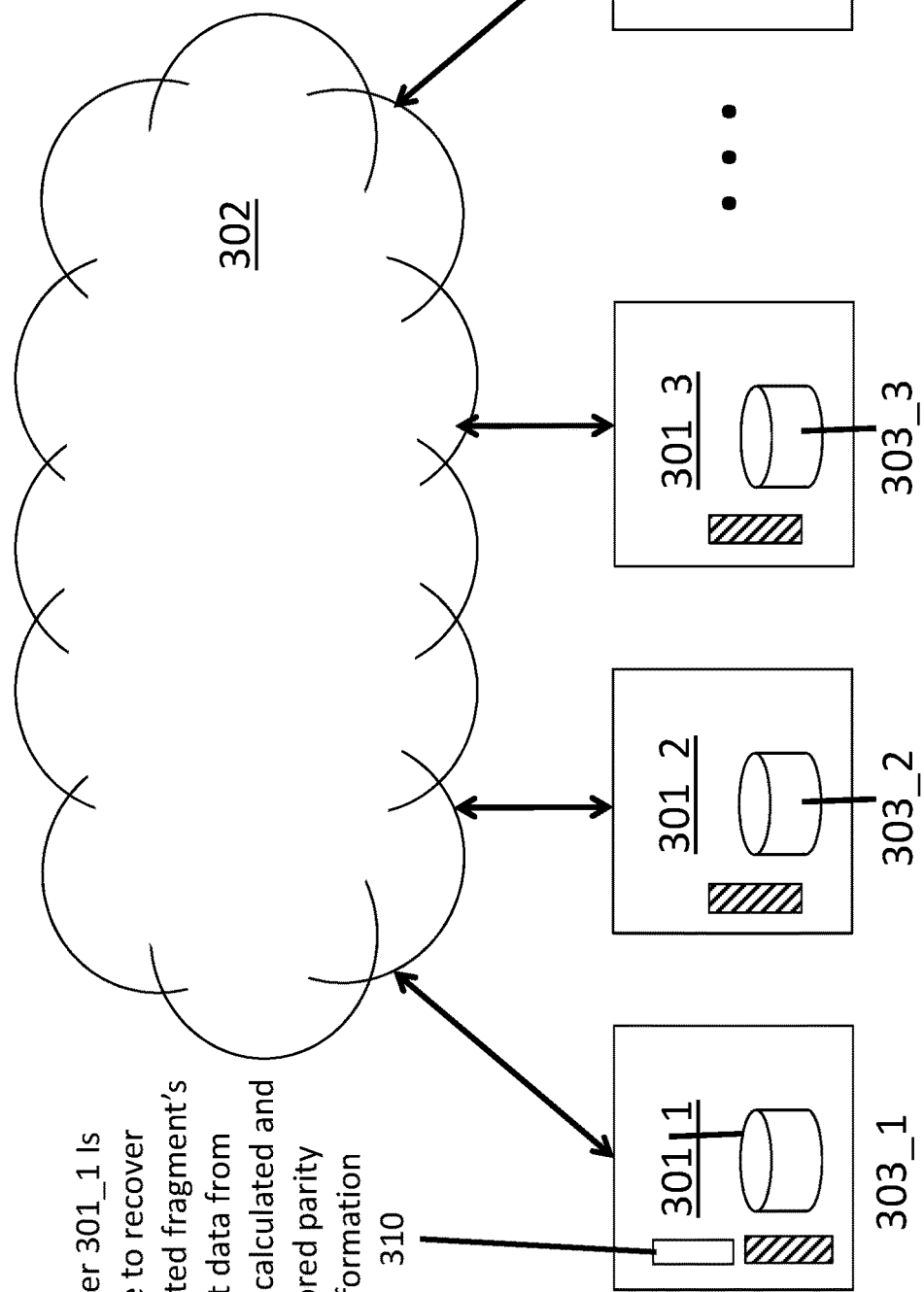

FIGS. 3*a* and 3*b* show a second prior art encoding and information error recovery process. Referring to FIG. 3*a*, the object's data 304 is fragmented into multiple data fragments 305 but no parity information is initially calculated for the object 304. The fragments 305 are transported over the network 302 to different respective servers 301 for storage. Each server that receives a particular data fragment, however, performs an error correction encoding calculation on that fragment and stores it along with the newly calculated parity information into the server's storage devices 309. For ease of drawing FIG. 3*a* only provides explicit detail of the process for the first data fragment that is received at server 301_1. However, the reader should understand that the process 309 described in FIG. 3*a* for the first fragment and server 301_1 applies to the other fragments that are directed to other servers.

Referring to FIG. 3*b*, if one of the fragments becomes corrupted, the server that stores the corrupted fragment is able to recover the lost data from its own local error correction process 310. The local error correction process performs data recovery computations on the remaining (non corrupted) locally stored fragment data and the parity information that was locally determined at the server. The fully recovered data fragment and the parity information can then be restored within the server (e.g., within a different disk drive). Importantly, the amount of parity information that is initially calculated 309 at a server for a particular fragment must be sufficiently large so that the server can fully recover the lost information.

That is, as is known in the art, the more parity information that is appended to data being protected, the greater the likelihood a lost amount of the data will be fully recovered and/or the greater the amount of lost data that can be recovered. As such, in order to ensure the lost data can be recovered, extensive parity information is calculated for a fragment by the server.

For example, the amount of parity information may be greater than that needed to recover an amount of information that is highly unlikely to be lost in any single failure event within the server. For example, in one approach the server will divide the data fragment and parity information into smaller slices that are distributed across multiple disk drives within the server. The amount of parity information that is calculated for the fragment is sufficient to fully recover the fragment's data if multiple disk drives simultaneously fail resulting in loss of more than one slice.

Here, simultaneous failure of multiple drives is an extremely unlikely event. As such, in practice, enough parity information to recover from loss of only a single slice is sufficient. However, in an attempt to guarantee that all data losses can be recovered from, more parity information that what is sufficient to recover from loss of a single slice (e.g., loss of two or more slices) is actually calculated and stored for the data segment.

Thus, a problem with the prior art approach of FIGS. 3*a* and 3*b* is the amount of excessive parity calculation and the storage of that parity information for any particular segment. That is, the parity overkill leads to excessive server parity computations and/or a larger than desirable amount of server storage space being devoted to the storage of parity information rather than customer data.

To review then, the first data encoding and recovery process of FIGS. 2*a* and 2*b* is able to more efficiently calculate parity information over multiple segments but suffers from inefficient recovery because multiple segments have to be recalled over the network in order to perform the data recovery process. By contrast the second data encoding and recovery process of FIGS. 3*a* and 3*b* is able to more efficiently perform data recovery because it is performed locally at a server thereby avoiding transportation of segments over the network. Unfortunately, the second data encoding and recovery process is inefficient in that comparably more parity information is calculated for the data segment resulting in more parity computation time and more storage space being devoted to the storage of parity (rather than data).

Figure 4A:
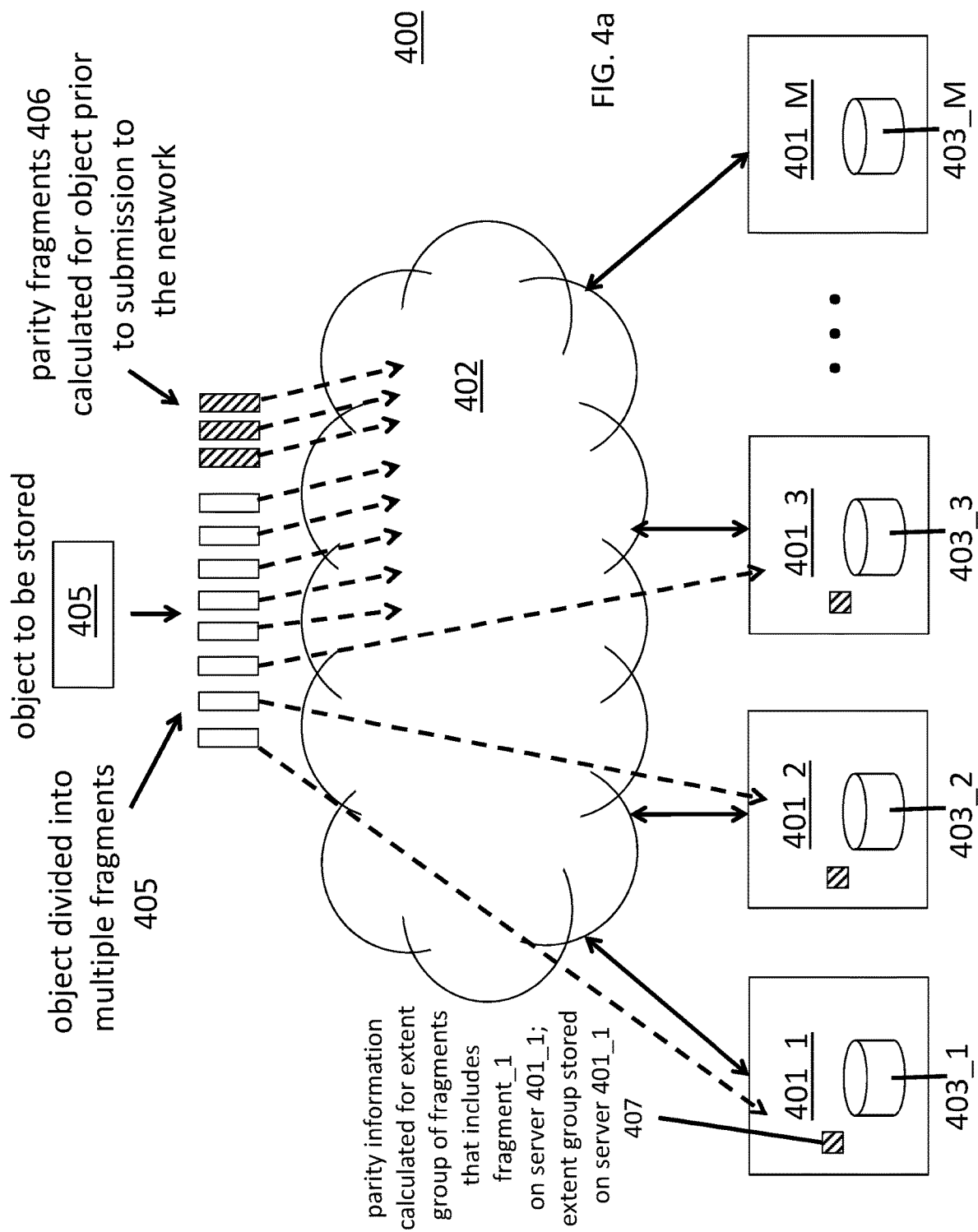
Figure 4C:
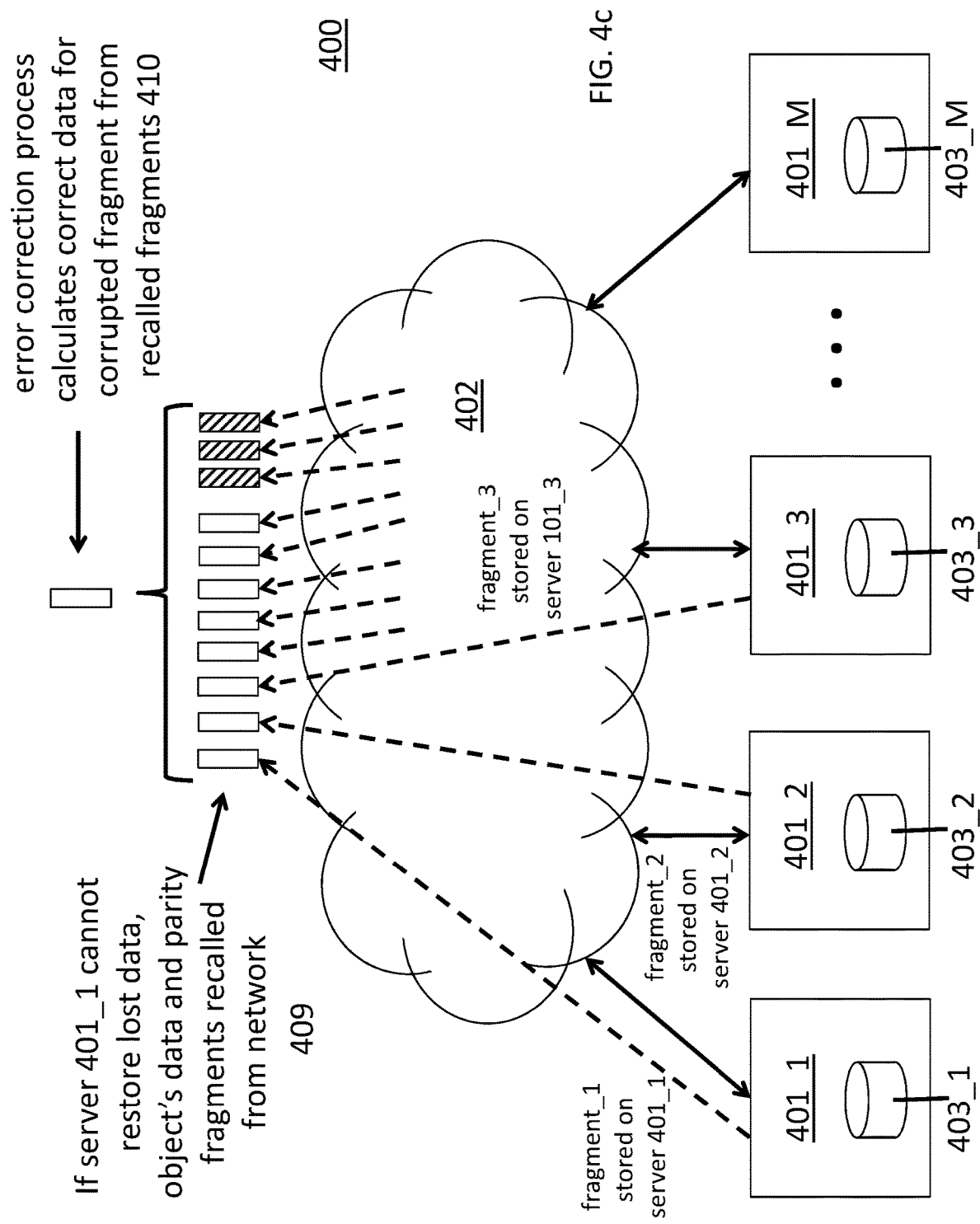

2.0 Improved Data Protection Schemes for Large Scale Distributed Object Storage Systems FIGS. 4*a* through 4*c* show an improved data encoding and recovery process that assumes features of both of the first and second processes so that neither of their inefficiencies are fully realized. As observed in FIG. 4*a*, akin to the first process of FIGS. 2*a* and 2*b*, an encoding process is collectively performed over an object's multiple data fragments 405 to generate multiple parity fragments 406. The multiple data fragments 405 and parity fragments 406 are directed over the network 402 for storage across different ones of the servers 401_1 through 401_M.

For ease of drawing FIG. 4*a* does not show any particular entity performing the fragmentation of the object or the encoding process that generates parity information 406. Such an entity may be, e.g., any interface that provides access to the storage system. Such an interface may execute on a client computer system that is communicatively coupled to the storage system. The interface may be provided by and/or may be communicatively coupled to, e.g., any of the storage servers 401_1 through 401_M. As such, any one of servers 401_1 through 401_M may be submitting the object fragments 405 to the network, performing the error correction encoding that generates the parity fragments 406 and submitting the parity fragments 406 to the network 402.

Upon receipt of a fragment by a server, and unlike the encoding process of FIGS. 2*a* and 2*b*, additional parity information is calculated at the server for the segment 407. However, unlike the encoding process of FIGS. 3*a* and 3*b*, the parity information is not calculated at the server for the fragment specifically. Rather, the parity information is calculated over an accumulated number of fragments that are received at that server (over time the server is expected to receive a stream of fragments from multiple objects being stored in the system).

Because parity is calculated over an accumulated number of fragments rather than a specific fragment, the parity coverage that is calculated at the server is thinner than the approach of FIGS. 3*a* and 3*b* which, in various embodiments, correspond to parity coverage that is just sufficient for only more common data loss events that occur at the server.

The thinner parity coverage eliminates/reduces the parity overkill problem discussed above with respect to the data encoding and recovery process of FIGS. 3*a* and 3*b*. Additionally, as will be discussed below with respect to FIG. 4*c*, in the event that a server is not able to recover lost data because of the thinner coverage that is generated at the server, the data and parity fragments for the object whose data has been lost can be recalled from the other servers across the network 402 and used to recover the lost data similar to the recovery process of FIG. 2*b*. As such, the storage system can still recover the lost data even if the thinner parity coverage provided at a server is not able to immediately recover it locally at the server.

FIG. 4b shows a first recovery process in which data that is lost at the server is first attempted to be recovered locally at the server 408. Here, because the thinner parity information that is generated at the server is calculated over a number of data fragments that were received at the server, in an embodiment, the group of data fragments that include the data fragment(s) having the lost data and the parity fragments that were calculated from them (the total combination referred to as an "extent") are internally read by the server from the server's data storage devices so that the server can perform the recovery process for the lost data using the extent's collection of data fragments and the corresponding parity fragments calculated from them.

As discussed above, however, because the parity coverage is thinner at the server, in some instances the server will not be able to recover the data for a fragment that has become corrupted. In this case, as observed in FIG. 4c, the corrupted fragment's sibling data fragments and parity fragments that are associated with the corrupted fragment's object are read from their corresponding servers 409 and sent to a same location so that the lost data can be recovered 410 by a recovery process similar to that discussed above with respect to FIG. 2b. Thus, the inefficiency of recalling multiple fragments over the network 402 only occurs in the relatively rare cases where the server's thinner parity coverage is insufficient to recover the lost data locally at the server. The data recovery operation of FIG. 4c may be performed, e.g., at a server that is, e.g., a registered "owner" of the object, the server that stores the corrupted fragment and could not recover its lost data or some other server or computing system (e.g., a centralized data recovery server).

Figure 5A:
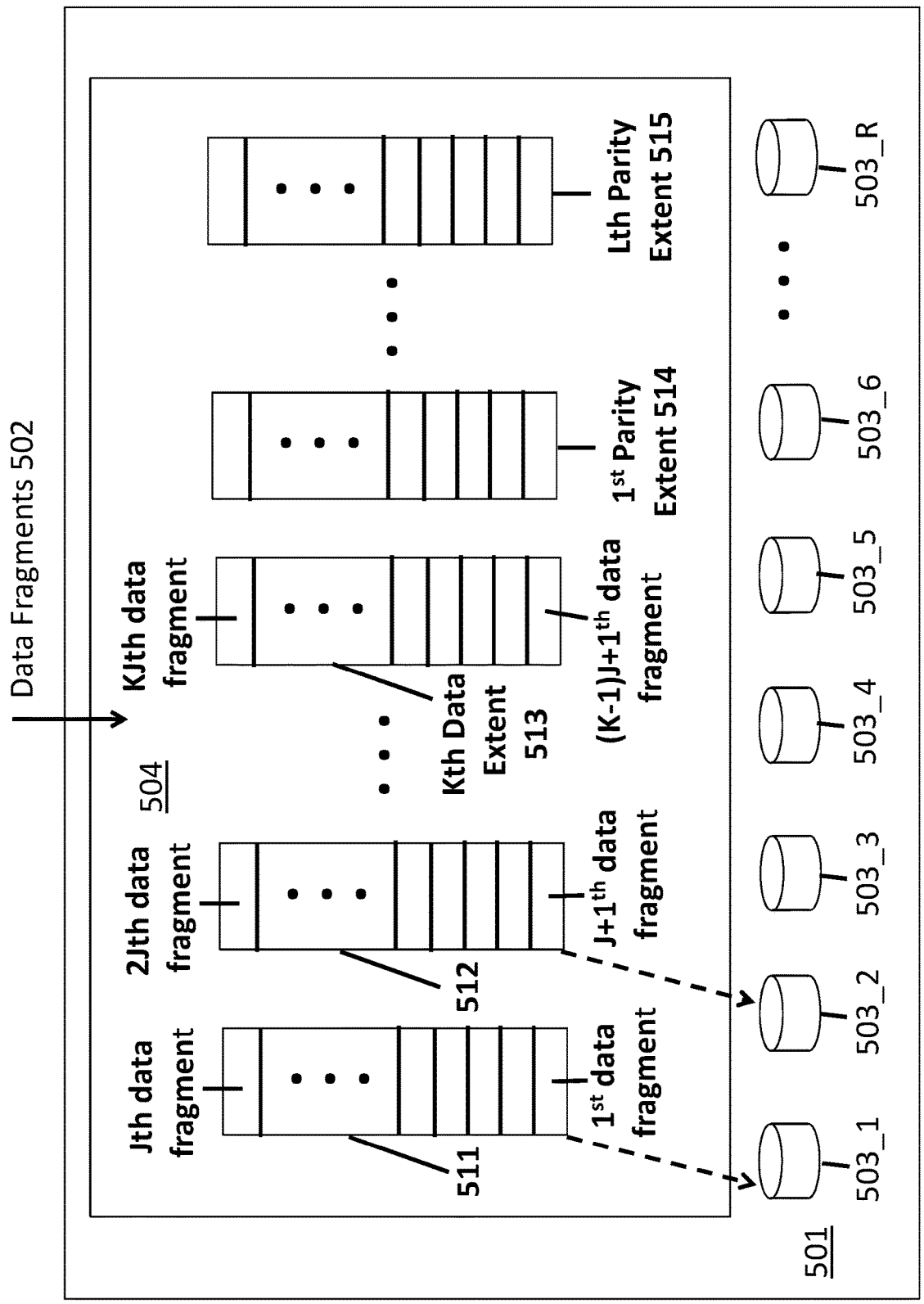
FIGS. 5a and 5b show an extent group based encoding and recovery process.

FIG. 5a shows a more detailed view of the processing that occurs within a server to calculate parity coverage for an extent group. Here, a server that is a member of the distributed object storage system is expected to receive a stream of fragments 502 for different objects over time. Recalling from the discussions above, an object's storage in the system entails the distribution of its data fragments and parity fragments across different servers within the network. As such, if the overall storage system is tasked with storing a series of objects, each server of the storage system should expect to receive a stream of fragments 502 from at least a subset of these objects over time (where the respective fragments of each server's received fragment stream may originate from a different combination of objects being stored).

For simplicity, the fragments of the fragment stream 502 that are received by the server 501 are referred to as data fragments because, from the perspective of the server 501, they each contain data that needs to be stored by the server and protected by the server's own local parity protection mechanism. Note, however, that these received "data" fragments 502 may contain true object data or parity data that was calculated for an object by the prior encoding scheme before being sent to the server 501.

As observed in FIG. 5a, the server 501 includes a plurality of different storage devices 503_1 through 503_R such as a plurality of hard disk drives and/or a plurality of solid state disk devices. The server's error correction encoding processing resources, which may be implemented in software (such as application software that executes on the server's CPU), hardware (such as hardwired or programmable logic circuitry) or a combination of software and hardware, processes the fragment stream 502 to calculate parity information for the fragments.

In the embodiment of FIG. 5a, the server's encoding processing resources 504 conceptualizes the assignment of multiple fragments to a same "extent" and after a plurality of extents worth of fragments have been received by the server, parity information is calculated for the entire "extent group" 504.

For example, in the particular example of FIG. 5a, each extent is deemed to correspond to J fragments and a specific extent is assigned to a specific storage device within the server. In the example of FIG. 5, extent 511 is the first data extent in extent group 504 and its associated data fragments are assigned for storage in storage device 503_1. As the stream of data fragments 502 that mark the start of extent group 504 are received by the server 501, the server 501 immediately stores the data fragments into storage device 503_1 until J data fragments have been received by the server (and stored into storage device 503_1).

With the first J data fragments of the fragment stream 502 having been received (and stored) by the server 501, the first data extent 511 is deemed "filled" and the encoding process recognizes that a next, second data extent 512 is to be processed. Here, the data fragments of the second data extent 512 are assigned to storage device 503_2. As such, in handling the second data extent 512, the J+1th data fragment to be received by the server is stored into storage device 503_2. That is, the J+1th data fragment, being a member of the second data extent 512, is stored in a different storage device 503_2 than the storage device 503_1 that was used to store the data fragments of the first data extent 511.

The subsequently received stream of data segments 502 after the J+1th data fragment up to the 2Jth data fragment are each stored in storage device 503_2 in succession as they are received. Upon the 2Jth data fragment being received (and stored) by the server 501, the second data extent 512 is deemed filled and the process again repeats for a third extent (not shown) whose first data fragment corresponds to the (2J+1)th data fragment to be received by the server. The third data extent is assigned to yet another different storage device in the server (e.g., storage device 503_3) and, as such, the (2J+1)th through 3J data fragments next to be received by the server are stored in the different storage device.

When K data extents 511-513 have been filled (e.g., when KJ data segments have been received by the server and stored across K different storage devices within the server), the data portion of the extent group 504 has been received by the server 501 which triggers the parity calculation for the extent group 504. Here, the encoding process calculates L extents worth of parity information 514-515 for the extent group 504. In an embodiment, each of the different L parity extents 514-515 are then stored in different storage devices of the server than the storage devices that are used to store the K different data extents. As such, in an embodiment, K+L different storage devices are used to store the different extents of the extent group 504. Therefore, in an embodiment, the number of storage devices in the server is greater than or equal to K+L.

Also in an embodiment, in order to calculate the L parity extents 514-515, the segments of the K data segments 511-513 that were stored in their respective storage devices upon reception by the server are read back from the storage devices by the server's encoding processing intelligence in succession in order to calculate the L parity segments 513-515. In an embodiment, e.g., that is implemented on a server having hard disk drive storage systems, the total amount of data of an extent is viewed as being equal to a number of equal sized sectors (i.e., extent size=Q×(sector size), where Q is the number of sectors within an extent) and the fragment data that fills as extent is organized into the extent's sectors. Here, as is known in the art, the basic unit of storage of a hard disk drive is a sector and so the fragment data is forced to fit into such basic units of storage.

In various embodiments, each of the data extents are of the same size and each of the parity extents are of the same size. In further embodiments each of the same sized parity extents are of same size as the data extents. In still further embodiments each of the data extents and/or parity extents are understood to contain matrices of data where the matrices of the data extents have same dimension as between parity extents, as between data extents and/or as between data and parity extents.

Figure 5B:
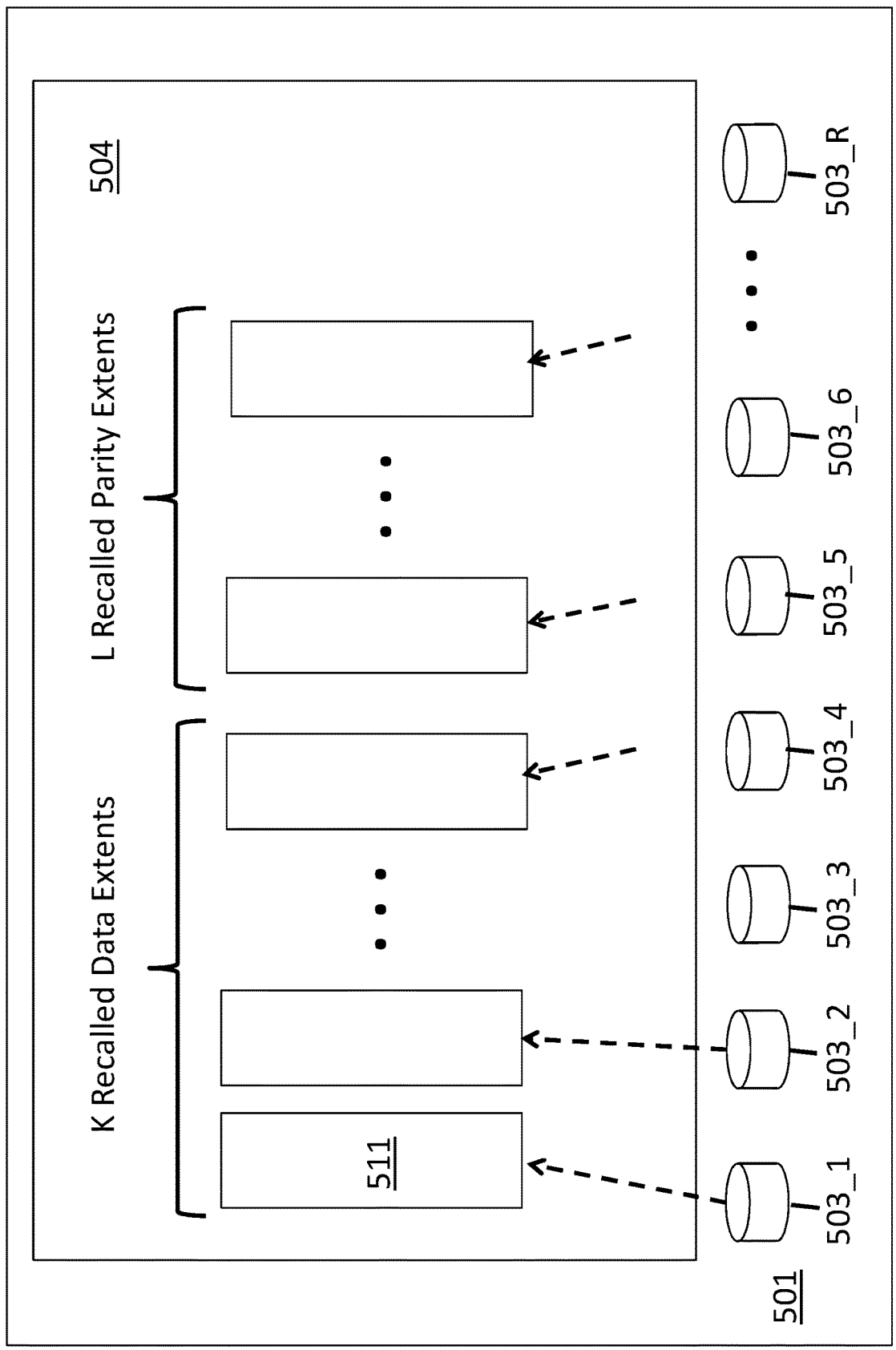

As observed in FIG. 5b, in case one of the extents, either data or parity, becomes corrupted (e.g., due to a failure of its corresponding storage device), the extents of the extent group 504 are read from their respective storage devices and processed by the data recovery process of the server's error correction encoding intelligence in order to recover the corrupted data. In various embodiments less than all of the extents are needed to recover the data (data can be recovered even if an entire extent is lost). If the recovery is successful, the extent that was corrupted that has had its corrupted data recovered may then be stored in another storage device within the server 601 rather than its original, e.g., failed, storage device.

As discussed at length above, in some cases the amount of corruption may be beyond what the extent group based parity protection provided by the server 501 is able to recover. In that case, the affected fragments of the affected extent(s) are recovered by recalling the sibling fragments of their respective objects over the network as discussed above with respect to FIG. 4c. For example, if extent 511 is corrupted and the extent group based parity protection provided by the server is insufficient to recover the lost data, the data recovery process of FIG. 4c is performed for each of the J objects that the 1$^{st}$ though Jth data fragments of extent 511 are associated with. Here, in various embodiments, less than all the fragments of an object are needed to recover the corrupted information (information can be recovered even if an entire fragment is lost).

Figure 6:
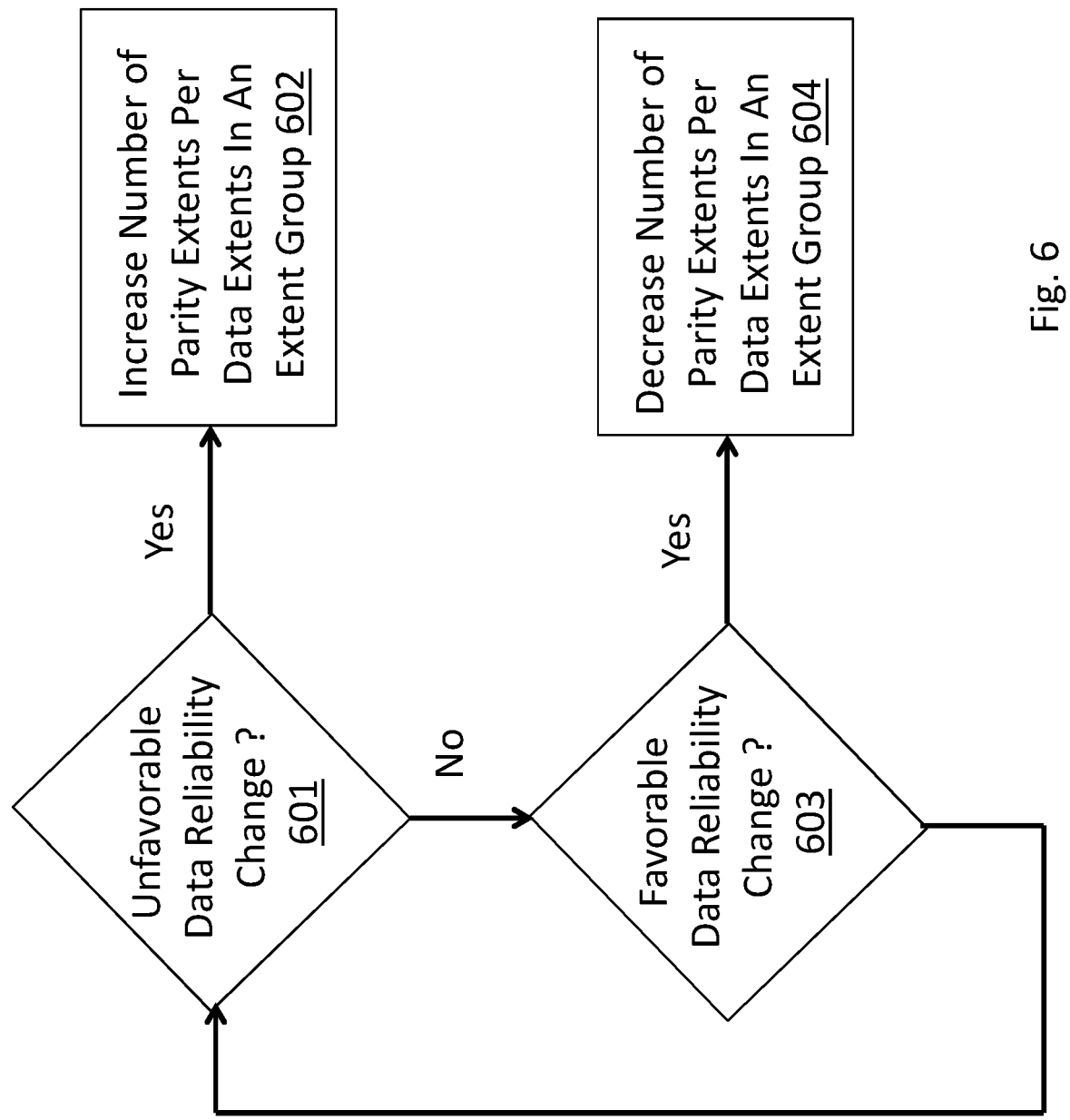
FIG. 6 shows an encoding process that changes parity coverage in response to a favorable/unfavorable data reliability events.

In further embodiments, as observed in FIG. 6, the dimension of an extent group can dynamically change, e.g., based on conditions observed within the server. For example, if a data integrity reliability threshold is crossed in an unfavorable direction 601 (the error rate from the server's storage devices has exceeded some threshold, a temperature has risen above a threshold, etc.), then, in response, the server may increase its extent group based parity protection 602.

For example, if the server was originally providing three extents worth of parity protection for every six data extents (i.e., an extent group corresponds to six data extents and three parity extents), in response to an observed decline or potential in data reliability 601, the extent group based parity calculations being performed by the server may be changed so that four (rather than three) parity extents are calculated for every six data extents.

Alternatively, rather than calculate more parity extents for a same number of data extents in an extent group, the server may calculate the same number of parity extents for an extent group but include fewer data extents within the extent group. For example, again if the server was originally providing three extents worth of parity for every six extents of received data, the server may alter its extent group parity protection calculations so as to define an extent group as including three parity extents (the number of parity extents per extent group remains unchanged), but the number of data extents per extent group is reduced to five or four data extents per extent group.

Correspondingly, if a data integrity reliability threshold is crossed in a favorable direction 603 (the error rate from the server's storage devices has fallen beneath some threshold), then, in response, the server may provide less parity protection that it had been providing 604. For example, if the server was originally providing three extents worth of parity protection for every six data extents (i.e., again, an extent group corresponds to six data extents and three parity extents), in response to an observed improvement in the reliability of the server's storage devices 603, the parity calculations being performed by the server may be changed so that two (rather than three) parity extents are calculated for every six data extents.

Likewise, rather than calculate less parity extents for a same number of data extents in an extent group, the server may calculate the same number of parity extents for an extent group but include more data extents within the extent group. For example, again if the server was originally providing three extents worth of parity for every six extents of received data, the server may alter its extent group parity protection calculations so as to define an extent group as including three parity extents (the number of parity extents per extent group remains unchanged), but the number of data extents per extent group is increased to seven or eight data extents per extent group.

Besides responding to reliability trends, other observed trends within the server may trigger a change in the formulation of the number of parity extents that are calculated per number of received data extents.

Figure 7:
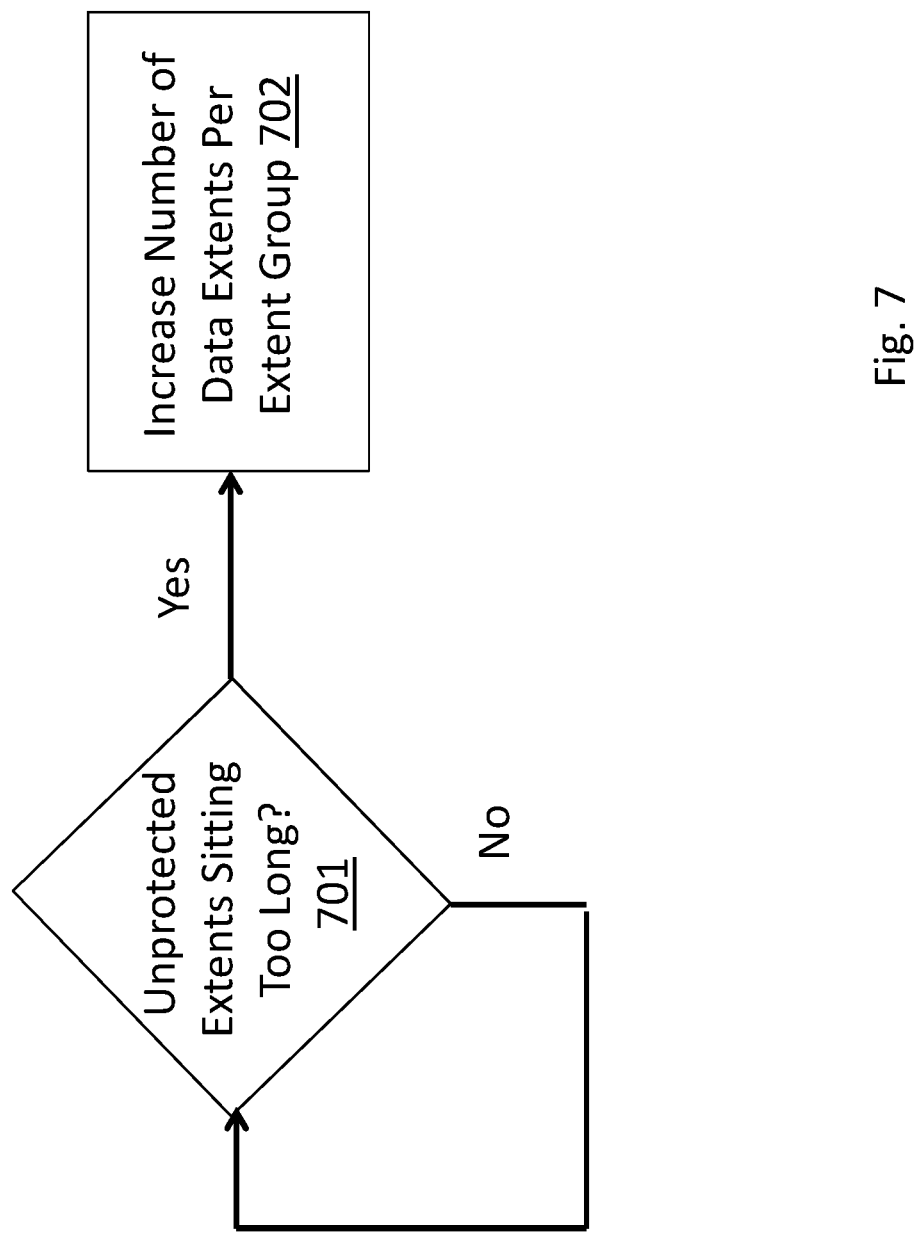
FIG. 7 shows an encoding process that changes parity coverage in response to an unprotected data time lapse.

For example, referring to FIG. 7, observed traffic flows may trigger a change in the amount of parity protection per extent group. Consider an example where the server's current scheme is to calculate, in forming an extent group, three parity extents for every six received data extents, and, after storing a preceding complete extent group (including six received data extents and three received parity extents) in its local storage devices the server receives two immediately following extents worth of fragments and then does not receive any more data fragments for an extended period of time. Here, the fragments of the two most recently received data extents are being stored in the server's storage devices unprotected.

As such, after a time threshold in which the unprotected extents are deemed to be sitting in storage unprotected for too long 701, in order to afford these two data extents some protection, the server may recall the six data extents from the immediately prior complete extent group and calculate, e.g., three new parity extents from the eight data extents that correspond to the previous six data extents of the previously received complete extent group and the two most recently received data extents. That is, a new extent group is formed having eight data extents and three parity extents.

Because more data extents are included in the extent group 702, the server may choose to increase the number of parity extents (e.g., to four parity extents to cover the eight data extents). So doing would keep the degree of protection approximately the same (amount of parity=50% the amount of data). Alternatively the same number of parity extents may be calculated thereby "thinning" the parity protection at least for the six data extents associated with the preceding complete extent group.

Further still, if the slowdown in received data fragments is recognized as being persistent, the server may also reduce the dimensions of an extent group so that data extents are protected approximately as received and without sitting in storage for extended periods of time without protection. For example, in response to the observed slowdown in received incoming data fragments, the server may also decide to adopt a new extent group dimension defined as two data extents and one parity extent. In this case, the two newly received data extents could be protected by calculating one parity extent to cover both of them and recognizing the thee extents (two data and one parity) as an extent group. In this case, the same parity coverage ratio (amount of parity=50% amount of data) is maintained but data extents will be protected in storage more frequently.

Figure 8:
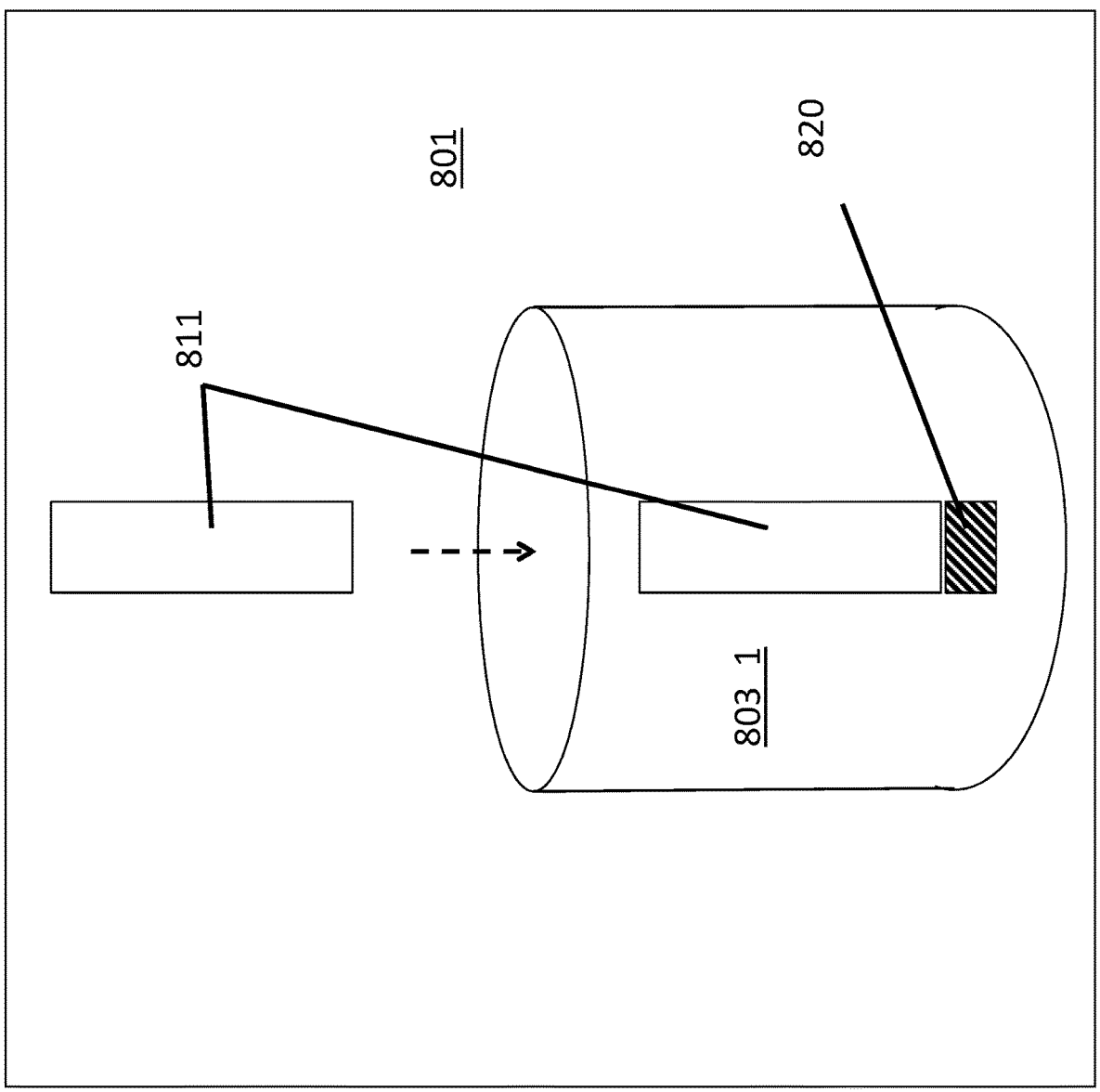
FIG. 8 shows an extent based encoding process.

FIG. 8 pertains to a further embodiment of the object storage encoding approach described just above with respect to FIGS. 4*a-c* and 5*a-b*. More specifically, FIG. 8 describes a second parity protection process performed within a server 801 that is applied to an extent 811 prior to the extent's storage in the storage device 803_1 that the extent has been assigned to be stored within.

Here, as indicated by FIG. 8, viewing data extent 811 as data extent 511 of FIGS. 5*a-b* and data storage device 803_1 as data storage device 503_1 of FIGS. 5*a-b*, note that data extent 511/811 can be stored in data storage device 503_1/803_1 with parity information 820 have been calculated as part of data extent's storage to provide additional error correction protection for the data extent. Thus, referring to the situation of FIG. 5*b* in which data extent 511 has become corrupted, in a further embodiment, rather than immediately recall all extents of the extent group 504, instead, the parity information 820 for extent 511/811 is processed with corrupted extent 511/811 in an attempt to recover the corrupted data within extent 511/811 without reliance on other extents in the extent group that data extent 511/811 belongs to.

In this case, only if the data recovery attempt is unsuccessful does the server transition to a "fallback" recovery process described above with respect to FIG. 5*b*. Thus, there can be as many as three distinct parity protection dimensions (in succession, the recovery process of FIG. 8, the recovery process of FIG. 5*b* of the recovery process of FIG. 8 fails, and the recovery process of FIG. 4*c* if the recovery process of FIG. 5*b* fails). Note that the extent specific encoding of FIG. 8 can be in and of itself "thinner" protection than the prior art parity protection described above with respect to FIG. 3*a* because the encoding of FIG. 8 is performed over multiple fragments (an extent) rather than just a single fragment (as in FIG. 3*a*). Here, the thinner protection is acceptable because of the higher level protections provided by the encoding of FIG. 5*a* and the first encoding of FIG. 4*a*.

Different types of encoding processes may be applied at any of the three distinct parity protection dimensions referred to above. In one embodiment, maximum distance separable code (MDS) may be applied at all three of these dimensions. Here, as is understood in the art, an MDS encoding process can view the data to be encoded as a matrix of data and can perform mathematical operations on the matrix of data to generate one or more matrices of parity data.

As such, the data content 405 of the object being fragmented in the first encoding process of FIG. 4*a* can be viewed as a matrix to which a first MDS encoding process is applied that generates matrices of parity information 406. The Appendix describes an exemplary MDS encoding scheme (referred to as "ECN") for the first encoding process of FIG. 4*a*.

Likewise, with respect to the next encoding process of FIG. 5*a*, each of the K data extents 511-513 may be viewed as matrices that a second MDS encoding process performs mathematical operations upon to generate the L parity extents 514-515 which are also viewed as matrices of parity information. The Appendix also describes an exemplary MDS encoding process (referred to as "ECE") for the encoding of FIG. 5*a*.

Lastly, the third encoding of FIG. 8 that is performed over an extent 811 may also be performed with an MDS encoding approach that views a single extent 811 as a matrix of data that the encoding of FIG. 8 performs mathematical operations upon in order to generate parity information 820 that is also viewed as a matrix. The Appendix also provides an exemplary encoding process (referred to as "ECS") for the encoding of FIG. 8.

Figure 9:
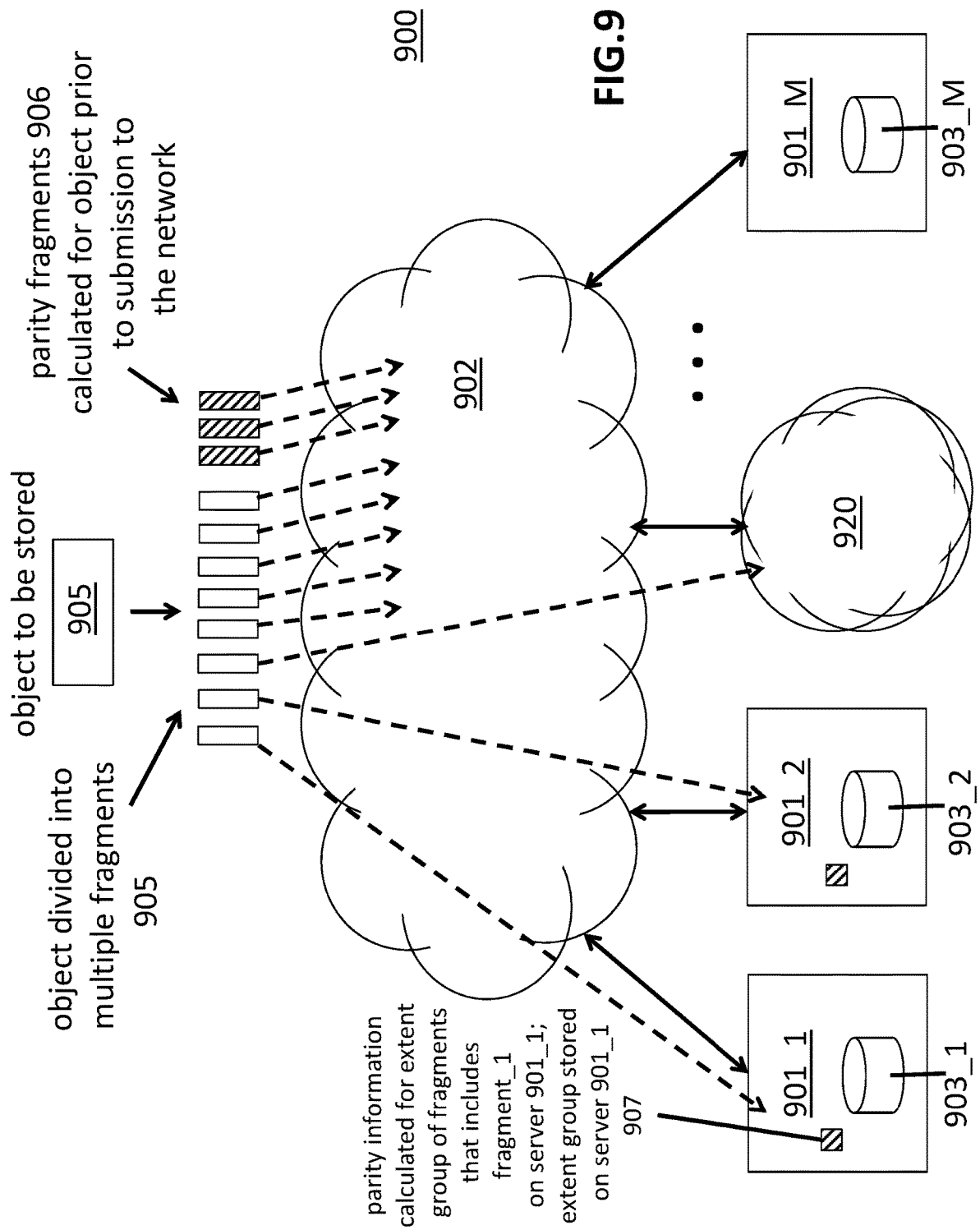
FIG. 9 shows an embodiment implemented on a cloud storage service.

FIG. 9 shows another embodiment in which one of the servers of FIG. 4*a* is replaced with a cloud storage service 920 (such as an Amazon S3 cloud storage service). As such, the initial fragmentation of the object 905 and the determination of the object's parity fragments 906 can be performed and the data and parity fragments can be spread over a combination of servers 901_1, 901_2 and the cloud service 920, etc. If the servers 901_1, 901_2, etc. are fitted with the additional functionality to calculate parity information for extent groups of fragments (e.g., as depicted as process 407 of FIG. 4*a*) and/or extents individually (e.g., as depicted in FIG. 8), the servers 901_1, 901_2, etc. can provide additional parity protection for the initial object's data and parity fragments 905, 906. Thus, should any of these fragments suffer a corruption the servers can attempt to reconstruct the corrupted data from these local protection mechanisms.

By contrast, the servers internal to the cloud storage service 920 may not be fitted with these local parity protections. As such, if a fragment stored in the cloud storage service 920 becomes corrupted and if the cloud storage service's own protection mechanisms are unable to recover the lost data, a fallback plan is to perform the recovery method of FIG. 4*c*. That is, fragments stored on the servers 901_1, 901_2 and the cloud storage service 920 are respectively read from servers 901_1, 901_2 and the cloud storage service 920 to recover the corrupted data from the object's original collection of data fragments 905 and parity fragments 906. Likewise, the recovery mechanism of FIG. 4*c* can also be performed if any of the servers 901_1, 901_2 are not able to recover any corrupted data locally.

For simplicity FIG. 9 only shows one cloud service 920 but in practice more than one cloud storage service may be used to store more than one fragments. For example, for an object that is fragmented into seven data fragments and three parity fragments, four of the ten total fragments may be stored on four different cloud storage services (or at least through four different cloud storage service interfaces) and the other six fragments may be stored on servers. Here, data corruptions that cannot be remedied locally at the servers or within the cloud services would cause the fallback recovery mechanism of FIG. 4*c* to be performed in which six fragments from the six servers and four fragments from the four storage services would all be read from their respective servers and cloud storage services and the ten fragments processed to recover the lost data. In an extreme example there are no servers and storage of all fragments is implemented on multiple different cloud storage services (or at least through multiple different cloud storage interfaces).

3.0 Implementation Comments

Figure 10:
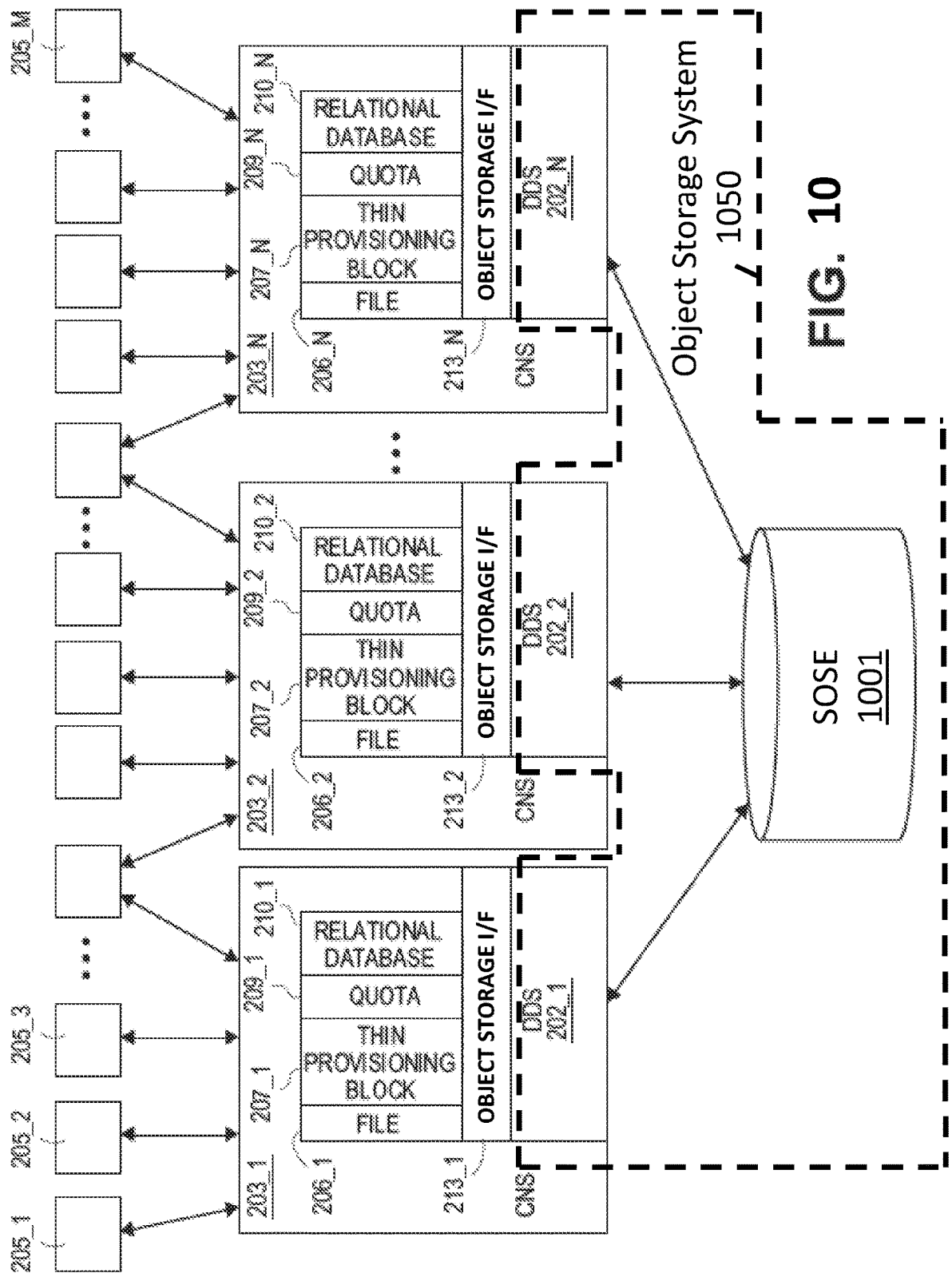
FIG. 10 shows an architecture of an object storage system.

The encoding improvements described above may be implemented, as stated above, on an object storage system. FIG. 10 shows an embodiment of an architecture for an object storage system 1000. As observed in FIG. 10, the architecture includes a set of storage entities (SOSE) 1001, a distributed database management system (DDS) 1002 (implemented with separate DDS instances 1002_1 through 1002_N) and a connectors node system (CNS) 1003 (implemented with separate CNS instances 1003_1 through 1003_N).

At a high level perspective, the SOSE 1001 can be viewed as the physical storage resource of the system. In various implementations the SOSE 1001 includes a combination of different types of storage entities (e.g., servers, ipdrives, object storage systems, cloud storage services, etc.). In various embodiments, the DDS instances and the SOSE combined behave as an over-arching object storage system 1050 in which items that are physically stored in the SOSE 1001 are identified with unique object IDs provided by the DDS. That is a requester/user that seeks to access an object in the object store 1050, provides an object ID to a DDS instance, which, in turn, causes the CNS to access that object in the SOSE. From the perspective of a requester/user that interfaces to the object store 1050 through the DDS, objects are units of fundamental storage in the object store. Each object is assigned its own unique (e.g., random) identifier that uniquely identifies its corresponding object. This particular type of access is distinguishing from other types of storage systems such as file systems (whose fundamental unit of storage, a "file", is identified with a directory path) and block storage systems (whose fundamental unit of storage, "a block" is identified with a numerically restrictive offset). In various embodiments, the SOSE 1001 includes at least one KVS object storage system in which objects are stored using distributed consistent database technology as described in U.S. patent application Ser. No. 14/198,486, published as U.S. Pub. App. No. 20150254272 entitled "Distributed Consistent Database Implementation Within An Object Store" assigned to Scality, S.A. and which is hereby incorporated by reference.

Here, in order to store fragmented objects, the fragments are stored as separate objects in the SOSE 1001 by the DDS where the object ID for each of these fragments is a combination of a base object ID for the whole object and a fragment ID that is specific to the fragment. In a further embodiment, some mathematical function is used to generate fragment IDs (e.g., from the base object ID) so that the fragment ID can be used to identify which fragment is missing when rebuilding the whole object from its multiple fragments. In various embodiment, the ID of the server that stores a fragment (server ID) is kept along with the fragment ID and/or base object ID in order to properly route an access request for a fragment within the SOSE.

Thus to summarize, for a given object ID whose corresponding object is stored in the object store 1050 formed by the DDS and the SOSE, a set of pairs (server ID and fragment ID for each fragment) needed for locating all fragments composing the object are also stored by the DDS. In various embodiments, the SOSE includes a cloud storage service and the fragments are stored in the storage resources that are made accessible through the cloud storage service interface (e.g., an S3 interface for a cloud storage service provided by Amazon). As such, with respect to the encoding approaches discussed above in the preceding section, a CNS/DDS instance will perform the encoding 405, 406 of FIG. 4*a* and the reconstruction 409, 410 of FIG. 4*c*, whereas, the individual storage servers within the SOSE will perform the encoding 407 of FIG. 4*a* and FIG. 8 and the error recovery of FIG. 4*b*, FIG. 5*b* and FIG. 8.

The DDS 1002 therefore can be viewed as a distributed management layer above the SOSE 1001 that provides an object storage interface 1013 to the SOSE. Additional interfaces 1006, 1007, 1010 may be provided on top of the object storage interface 1013 that permit the object storage system formed by the DDS and the SOSE to be used as file directory, block based storage system or relational database (or the object storage interface 1013 can be accessed directly to receive object storage behavior). A quota policing function 1009 may also be integrated with the interfaces 1006, 1007, 1010, 1013 to, e.g., prevent users from storing more data than their allocated amount in the DDS/SOSE storage system. In various embodiments, the DDS 1002 implements a distributed consensus algorithm and load balancing algorithms to effect widely scalable storage access to/from the SOSE storage resources 1001.

With the DDS 1002 and the CNS 1003 a wide range of different storage system interfaces to end-users 1005_1 though 1005_M. Here, an "end-user" or "user" or "requestor" is any entity that makes use of the DDS/SOSE object storage system. Examples include an application software instance, an application software process, a client computer instantiated with any one or more of these software instances/processes, an organization such as a corporation, etc.

With direct access to the object storage interface 1013, the CNS 1003 is able to provide various object store connectors/interfaces to end-users (e.g., Cloud Data Management Interfaces (CDMI), Simple Storage System (S3), etc.). With access to the file directory interface 1006 provided by the DDS 1002, the CNS 1003 is able to provide any directory file system connector/interface to end-users (e.g., Network File System (NFS), Common Internet File System (CIFS), File System in User Space (FUSE), etc.). Likewise with access to the block storage interface 1007 provided by the DDS 1002, the CNS 1003 is able to provide any block storage system connector/interface to end users (e.g., iSCSI, FC). Again, any/all of these different storage solutions may simultaneously be implemented on the DDS/SOSE object storage system. In an embodiment, a CNS instance fetches fragment IDs from its local DDS instance for the larger object being accessed and then accesses the fragments in parallel in the SOSE 1001 using the fragment IDs (e.g., all fragment IDs for a fragmented object are submitted to the SOSE by the CNS approximately simultaneously).

Figure 11:
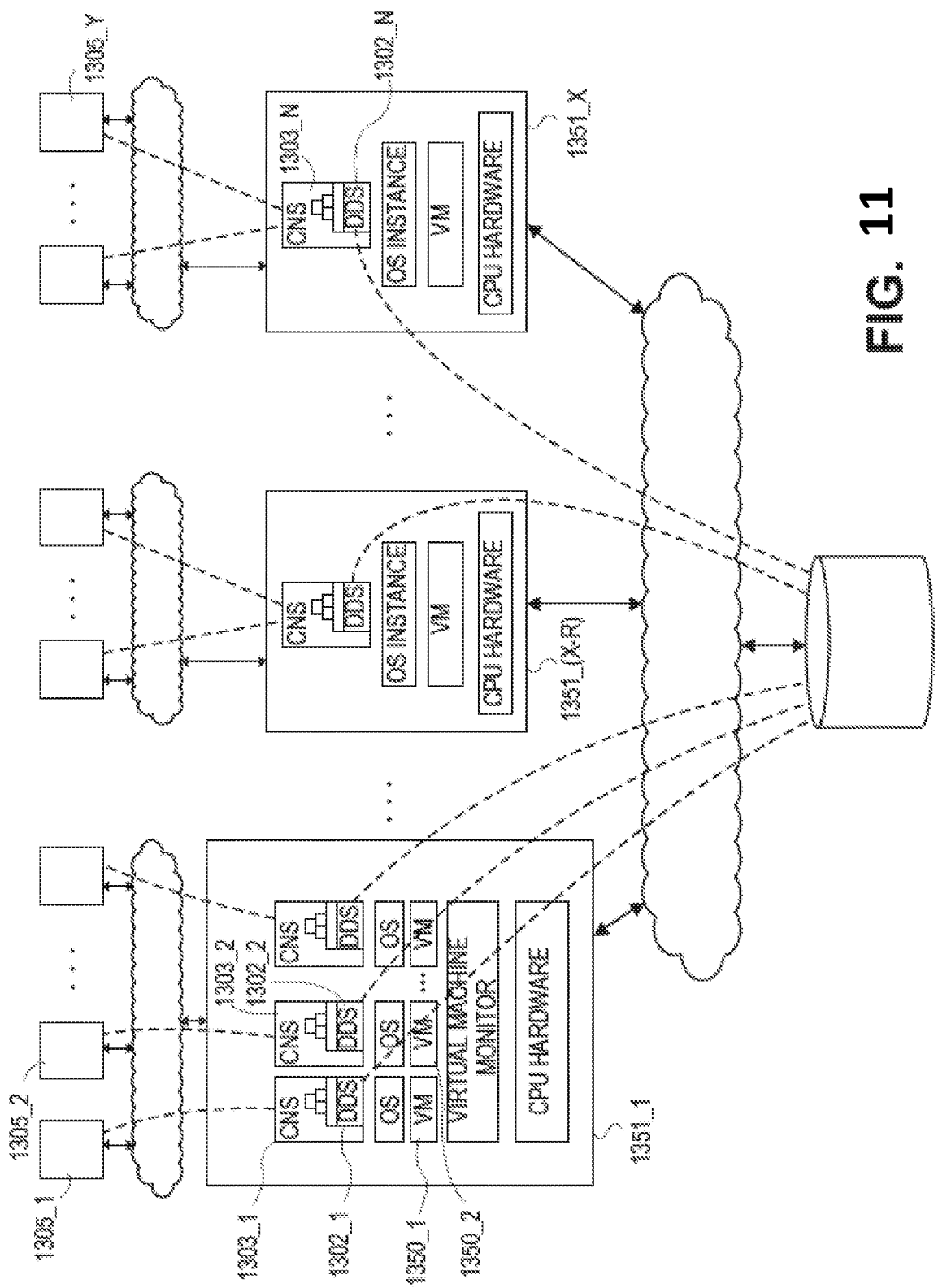
FIG. 11 shows an implementation of a large scale distributed object storage system.

FIG. 11 is a schematic depiction of various manners in which the architecture of FIG. 11 can actually be implemented in practice. As observed in FIG. 11, multiple CNS instances 1103_1 through 1103_N including their corresponding DDS stack 1102_1 through 1102_N can be configured to run on their own operating system instance and virtual machine 1150_1 through 1150_N. A single computing system (e.g., a server, a personal computer, a tablet device, a mobile handheld device, etc.) may support the execution of one or more CNS instances. In the case where multiple CNS instances are executed within a single computing system, the respective virtual machines of the multiple CNS instances may run on a virtual machine monitor. A CNS instance may also run on an operating system that runs directly on a computing system's CPU hardware (i.e., no virtual machine is utilized). Regardless, as depicted in FIG. 11, there may be more than one computing system 1151_1 through 1151_N each having at least one CNS instance with corresponding DDS stack.

As discussed with respect to FIG. 11, each CNS instance may support multiple users 1105_1 through 1105_N. The multiple users may be separated from their respective CNS node(s) by any of a wide area network (WAN), metropolitan area network (MAN), local area network (LAN). A user may even be an application instance running on the same computing system that is supporting its CNS node (no external network). Multiple users may be connected to any or all of the CNS nodes by way of a same network or multiple networks.

Likewise, each of the CNS nodes may be connected to the SOSE through any of a WAN, MAN or LAN. Conceivably a CNS node may run on a same computing system upon which a SOSE storage node is instantiated (i.e., no external network between the CNS node and the SOSE node). Multiple CNS instances may be connected to the SOSE by way of a same network or multiple networks.

The SOSE may be implemented as a distributed storage system composed of different types of storage entities. In this case, the various distributed nodes of the SOSE system are typically separated by a MAN, but may also be conceivably separated by a LAN and/or WAN.

A "cloud storage" service may be provided where the CNS nodes acts as gateways to the cloud storage service.

Processes taught by the discussion above may be performed with program code such as machine-executable instructions which cause a machine (such as a "virtual machine", a general-purpose CPU processor disposed on a semiconductor chip or special-purpose processor disposed on a semiconductor chip) to perform certain functions. Alternatively, these functions may be performed by specific hardware components that contain hardwired logic for performing the functions, or by any combination of programmed computer components and custom hardware components.

A storage medium may be used to store program code. A storage medium that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from remote computer (e.g., a server) to a requesting computer (e.g., a client) by way of data signals embodied in a propagation medium (e.g., via a communication link (e.g., a network connection)).

Figure 12:
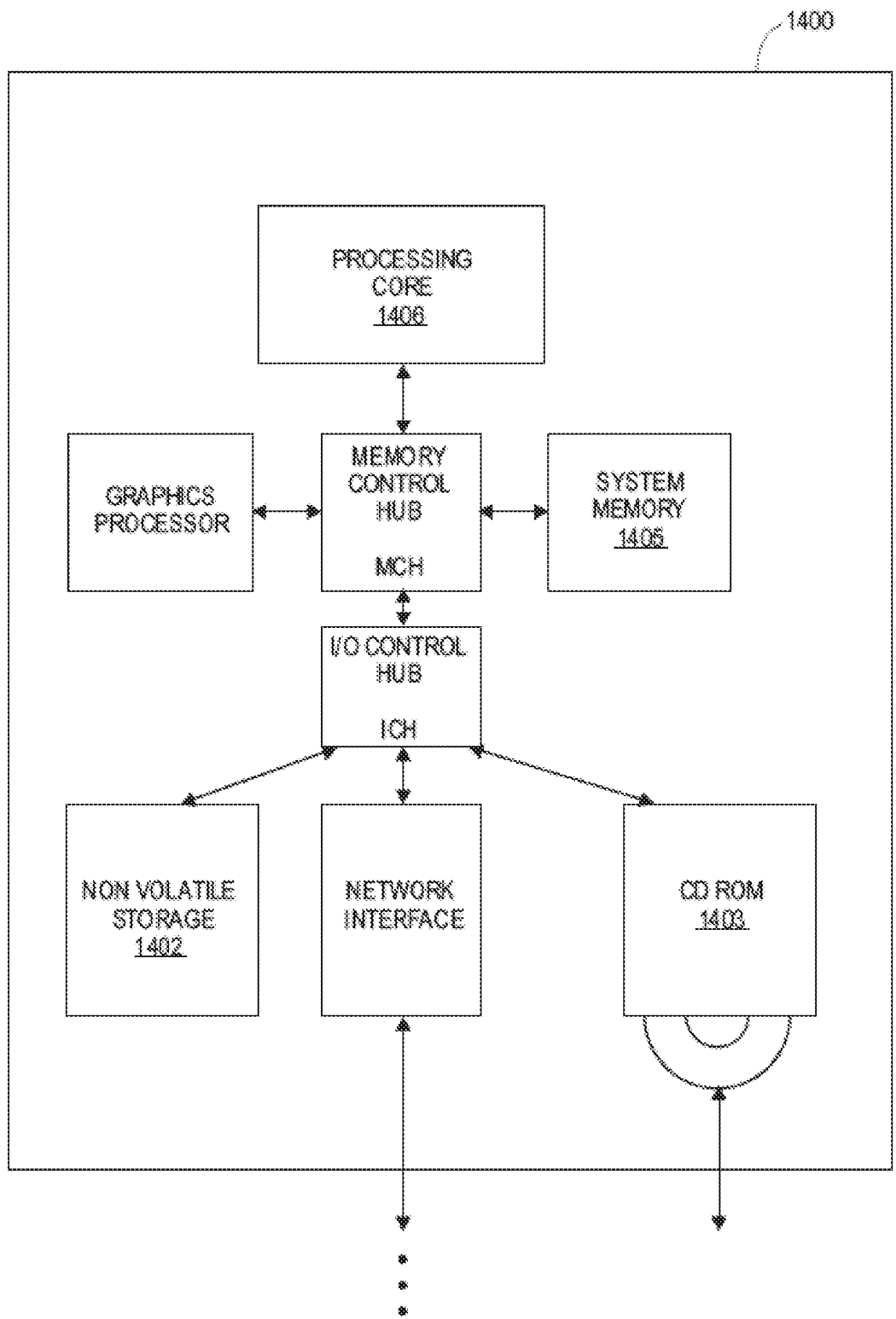
FIG. 12 shows a computer system.

FIG. 12 is a block diagram of a computing system 1200 that can execute program code stored by a storage medium. It is important to recognize that the computing system block diagram of FIG. 12 is just one of various computing system architectures. Different types of computing systems include mobile and/or handheld computing devices (e.g., smartphones, cell-phones, personal digital assistances), laptop personal computers, desktop personal computers, servers, etc.

The applicable storage medium may include one or more fixed components (such as non volatile storage component 1202 (e.g., a hard disk drive, FLASH drive or non volatile memory) or system memory 1205) and/or various movable components such as a CD ROM 1203, a compact disc, a magnetic tape, etc. operable with removable media drive 1204. In order to execute the program code, typically instructions of the program code are loaded into the Random Access Memory (RAM) system memory 1205; and, the processing core 1206 then executes the instructions. The processing core 1206 may include one or more CPU processors or CPU processing cores.

It is believed that processes taught by the discussion above can be described within various source code software environments such as, for example, object-oriented and/or non-object-oriented programming environments including but not limited to: C+/C++, PYTHON, Java, Erlang, JavaScript, etc. The source code can be subsequently compiled into intermediate code for translation on a translator/virtual machine, or, compiled into object code targeted for a specific processor instruction set architecture.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

APPENDIX

Description of ECN

ECN works on data objects being stored in the system. A [k, m] Maximum-Distance Separable (MDS) codes defined over a Galois field GF(q) transform a data object that is partitioned into equal-sized k data fragments, to (k+m) coded fragments. In the case of systematic codes, the set of coded fragments contains the k data ones. The original object can be reconstructed from any sub-set of k coded fragments. Note, MDS codes cover also a replication coding technique where each object is replicated into m copies and stored across multiple servers for redundancy/reliability.

1. ECN Construction.

ECN is systematic $[k_N, m_N]$ Reed-Solomon codes that can be constructed via Vandermonde matrices or a Cauchy matrix. Such constructions may use a Galois field $GF(q \geq k_N, +m_N)$.

2. Encoding Process.

ECN performs encoding process for every data object being stored into the system. $[k_N, m_N]$ ECN encodes a data object into $(k_N, +m_N)$ fragments that are then stored in different servers. The encoding process performs addition and multiplication arithmetic in GF(q).

3. Decoding Process.

The original data object will be constructed from at least $k_N$ fragments generated from the encoding process. Therefore, it protects data object for up to $m_N$ lost fragments from potentially unavailability servers that could be caused by failed connections, power interruption etc.

4. Repair Process.

Due to drive failures or unrecoverable drive sectors, some fragments of a given object are lost. ECN can repair up to $m_N$ lost fragments per object. The simplest way to repair them is to construct the data object from $k_N$ live fragments, then re-create the lost fragments.

Description of ECE

ECE works on extents in each server. Each extent is logically segmented into a sequence of continuous chunks of the same size that is also multiple of sector size. For a group of n extents, we group each of the n chunks at the same position of each extent into a stripe. The ECE works independently on each stripe.

We design ECE as a systematic [k, m] MDS codes with flexible choosing of two parameters k, m, i.e. two extent groups can contain different number of data and/or parity extents. Moreover, ECE support a dynamic encoding process that create/update extent groups with different parameters (k, m). It allows protecting extents as soon as possible. ECE starts once there are at least k pending data extents belonging to different drives. A construction method of such dynamic MDS codes is described below.

1. ECE Construction.

A [k, m] ECE is defined by a Parity-Check Matrix (thereafter called PCM) H composed of m rows and n=k+m columns. Entries of H are elements of a Galois field GF(a) of cardinality q≥n. We refer to each chunk as a symbol of GF(q). Without loss of generality, we refer also to each extent as a symbol of GF(q).

H is composed of two sub-matrices H=[G|I] where I is the [m×m] identity matrix, G is a [m×k] Cauchy matrix as below:

$$G = \left[ g_{i,j} := \frac{1}{x_i + y_i}; x_i, y_j \in GF(q), x_i + y_j > 0, 1 \le i \le m, 1 \le j \le k \right]$$

For a given (k, m) group, let E≈[$d_1, d_2, \ldots d_k, p_1, \ldots, p_m$] denote the vector of n=k+m extents where the first k elements corresponding to the k data extents, the last m ones corresponding to the m parity extents. Let D≈[$d_1, d_2, \ldots d_k$]$^t$ and P≈[$p_1, \ldots, p_m$]$^t$, hence $$H \times E = 0 \Leftrightarrow G \times D = P.$$

Operations of the above equation are performed in GF(q). Each data extent of D corresponds to a column of G and each parity extent of P corresponds to a row of G. We index row (column) of G from top-to-bottom (left-to-right respectively).

In an implementation, the coding scheme supports that every extent group contains at most k data extents and at most m parity extents. For a (k'≤k, m'≤m) group, its data and parity extents D=[$d_1, d_2, \ldots d_{k'}$]$^t$ and P=[$p_1, \ldots, p_{m'}$]$^t$ satisfy the following equation:

$$P = G' \times D$$

where G' is a sub-matrix of G, formed by its first k' columns and first m' rows. It means that the k' data extents correspond to the first k' columns of G and the m' parity extents correspond to the first m' rows of G.

2. Encoding Process.

The purpose of the encoding process is to create a ($k_1, m_1$) extent group from either a set of $k_1$ pending extents, or an existing ($k_2, m_2$) extent group (and other pending extents if relevant). We classify the creating of a ($k_1, m_1$) extent group into the following cases:

Case1: creating from $k_1$ pending extents from different drives. Let $D_1$=[$d_1, d_2, \ldots d_{k1}$]$^t$ denote the vector of the $k_1$ pending extents. We create $m_1$ parity extents denoted by $P_1$:=[$p_1, \ldots, p_{m1}$]$^t$ by using a sub-matrix $G_1$ formed by first $k_1$ columns and first $m_1$ rows of G:

$$P_1 = G_1 \times D_1$$

The $m_1$ parity extents will be stored in drives so that all extents of the group locate on different drives.

Case2: lengthening from an existing ($k_2, m_1$) group and ($k_1-k_2$) pending extents. In this case, we will create $m_1$ parity extents computed from data extents of the existing group and the pending data extents. Let $D_2$, $P_2$ denote two vectors of $k_2$ data extents and $m_1$ parity extents of the existing group, hence $$P_2 = G_2 \times D_2$$

where $G_2$ is formed by first $k_2$ columns of G and first $m_1$ rows of G. Let $D_1$ denote the vectors of ($k_1-k_2$) pending extents. We construct a [$m_1 \times (k_1-k_2)$] matrix $G_1$ formed by first $m_1$ rows of G and ($k_1-k_2$) columns of G that are next to these of $G_2$. The desired $m_1$ parity extents are computed from $k_2$ data extents of the existing group and ($k_1-k_2$) pending extents as below $$P_1 = [G_2 | G_1] \times \begin{bmatrix} D_2 \\ D_1 \end{bmatrix}$$

Equivalently, $P_1$ can be computed by the following way $$P_1 = P_2 + G_1 \times D_1$$

Therefore, $P_1$ can be determined by two ways:
(i) From $k_2$ data extents of the existing group and ($k_1-k_2$) pending extents, hence it requires to retrieve $k_1$ extents.
(ii) From $m_1$ parity extents of the existing group and ($k_1-k_2$) pending extents, hence it requires to retrieve ($k_1-k_2+m_1$) extents.

The second method is better if $k_2 > m_1$.

Case3: extending from an existing ($k_1, m_2 < m_1$) group. In this case, we need to create new ($m_1-m_2$) parity extents from $k_1$ data extents of the existing group in order to obtain totally $m_1$ parity extents for the group. We construct a [($m_1-m_2$)× $k_1$] matrix $G_1$ formed by first $k_1$ columns of G and ($m_1-m_2$) rows from ($m_2+1$)$^{th}$ to $m_1$$^{th}$ rows of G. The desired ($m_1-m_2$) parity extents, denoted by $P_1$, are computed from $k_1$ data extents ($D_1$ vector) by $$P_1 = G_1 \times D_1$$

Case4: shortening from an existing ($k_2 > k_1, m_1$) group. We will remove ($k_2-k_1$) data extents from the existing group. If the set of to-be-removed data extents is fixed as an input parameter, all $m_1$ parity extents will be created from remaining $k_1$ data extents as in Case1. Otherwise, we will choose to remove the last ($k_2-k_1$) data extents. Generally, all $m_1$ parity extents can be created from remaining $k_1$ data extents as in Case1. However, if $k_1 > (k_2-k_1)+m_1$, then such $m_1$ parity extents can be created by the following method that requires to retrieve only ($k_2-k_1$)+$m_1$ extents.

Let $P_2$ denote the vector of $m_1$ parity extents of the existing group. Let $D_2$ denote the vector of last ($k_2-k_1$) data extents that will be removed from the existing group. We construct a [$m_1 \times (k_2-k_1)$] matrix $G_1$ formed by first $m_1$ rows of G and ($k_2-k_1$) columns from ($k_1+1$)$^{th}$ to $k_2$$^{th}$ columns of G. The new $m_1$ parity extents, denoted by $P_1$, will be determined from $P_2$ and $D_2$ as below $$P_1 = P_2 + G_1 \times D_2$$

Case5: puncturing from an existing ($k_1, m_2 > m_1$) group. We will simply remove last ($m_2-m_1$) parity extents from the existing group.

Moreover, a combination of multiple such operations can transform an existing group to an arbitrary group of a desired number of data/parity extents.

3. Repair Process.

Supposing that there are e lost extents in a given (k', m'≥e) extent group, we'd like to re-create lost ones. Note that we know which extents of the group are lost. The parity-check matrix G' related to the group is formed from first m' rows and first k' columns of G. Let {$i_j$, 1≤j≤e} denote indices of lost extents. Let L denote a [m'×e] sub-matrix of G' formed from all rows and columns of indices {$i_j$, 1≤j≤e}. Let R denote a sub-matrix of G' formed from all rows and remaining columns, i.e. their indices ∉ {$i_j$, 1≤j≤e}. Let U, V denote vectors of e lost extents and (k'+m'−e) live extents of the group. We have $$[L|R] \times \begin{bmatrix} U \\ V \end{bmatrix} = 0 \Leftrightarrow L \times U = R \times V$$

The right side is known as V contains only known extents. The row-rank of sub-matrix L is equal to e as m'≥e and it is sub-matrix of a Cauchy matrix, then it's also a Cauchy matrix. Therefore, U can be determined from V.

4. Construction of PCM for Fast Encoding.

We describe a construction of ECE whose encoding process performs with low computation compared to normal MDS codes. Particularly, for the cases of no more than 2 parity extents per group, the constructed ECE ensures the lowest computation for encoding for variant values of k. The construction supports Galois fields $GF(q=2^p)$. Hence, each symbol can be represented as a binary vector of p elements. Equivalently, each extent can be represented by a vector of p elements.

Every symbol a of GF(q) can be represented by a [p×p] binary matrix denoted by B. The $i^{th}$ column of B is a binary vector representing the binary-based form of $2^i \times a$.

For example, in $GF(2^3)$ whose generator polynomial is $p(x)=x^3+x^2+1$, the binary matrix of 3 is below $$\begin{bmatrix} 1 & 0 & 1 \\ 1 & 1 & 0 \\ 0 & 1 & 0 \end{bmatrix} \text{ as } 3_{(base\ 10)} \equiv 011_{(base2)},$$

$$2 \times 3 = 6_{(base\ 10)} \equiv 110_{(base2)}, 2^2 \times 3 = 1_{(base\ 10)} \equiv 001_{(base2)}$$

Therefore, G can be transformed to a [pm×pk] binary matrix denoted by $G_b$. Since each 1 entry of $G_b$ corresponds to an exclusive-OR (XOR) operation in encoding process. Our target is to construct such matrix whose number of 1s is as small as possible. First, we introduce the below definition.

Definition 1 (binary density): for a given element α in $GF(2^p)$, its binary density is defined as the ratio of number of 1s in its binary matrix to $p^2$. A binary density of a row/column of G is the total binary density of its entries. Obviously, excepting zero, 1 is the smallest binary density element in $GF(2^p)$. Let S denote the set of k non-zero elements of smallest binary density of $GF(2^p)$ $$S=\{s_i, 1 \leq i \leq k, s_i > 0\}$$

Let a denote a non-zero element differing all inverses of elements of S, i.e. $\alpha \times s_i > 1$, $\forall s_i \in S$. If $k < 2^p - 1$, there always exists such number α. We desire to construct G whose
 The $1^{st}$ row contains all 1s,
 If m≥2, the $2^{nd}$ row contains all elements of S,
 If m≥3, next rows are of small binary density as possible.
 And they are ordered by an increasing binary density
Such matrix allows creating parity extents with smallest number of XOR operations. To do that, we construct a $[(2^p-k) \times k]$ Cauchy matrix $\tilde{G}$ from two sets $\tilde{X}=\{x_i \in GF(2^p), 1 \leq i \leq q-k\}$ and $\hat{Y}=\{y_j \in GF(2^p), 1 \leq j \leq k\}$. We choose the first two elements of g: $\tilde{X}$: $x_1=2$, $x_2=1$ and k elements of $\hat{Y}$ as follows:

$$y_j = \frac{x_1 + \alpha \times s_j \times x_2}{1 + \alpha \times s_j}$$

and all other $x_{i>2}$ are remaining elements of $GF(2^p)$. The chosen sets satisfy conditions: $x_i+y_j>0 \forall i, j$. Note, a new matrix created by performing elementary operations on $\tilde{G}$ is also a Cauchy matrix. Entry of $\tilde{G}$ at $i^{th}$ row and $j^{th}$ column is below:

$$g_{i,j} = \frac{1}{x_i + y_j}$$

We transform the $1^{st}$ row of $\tilde{G}$ to all 1s by multiplying elements of $j^{th}$ column by $(x_1+y_j)$, hence $$g_{i,j} = \frac{x_1 + y_j}{x_i + y_j}$$

Particularly, entries for the $2^{nd}$ row are below $$g_{2,j} = \frac{x_1 + y_j}{x_2 + y_j} \Leftrightarrow g_{2,j} = \alpha \times s_j$$

Then, we transform the $2^{nd}$ row to all elements of S by dividing each its entry by α. For each next rows, we process as follows decrease its binary density. For $i^{th}$ row, we find an appropriate non-zero element $\beta \in GF(2^p)$ so that total binary density of $\{\beta \times g_{i,j}, 1 \leq j \leq k\}$ is minimal. Then, we multiply each entry of the row with the found element β. Therefore, we transform all $i^{th}$ rows (i≥2) to these of lowest binary density. We sort such transformed rows by an order of increasing binary density. Finally, the desired [m×k] matrix G is constructed as the first m rows of $\tilde{G}$. Note, although the PCM is constructed by analyzing binary density of Galois field elements, it results in also low computation for encoding process using directly finite field arithmetic.

5. Rebuild Policy.

Each (k, m) extent group contains n=k+m extents which locate on different drives. If there are more than n drives, there are different ways to distribute its extents. In our storage system, extents of each group are distributed uniformly to all drives. Let N denote number of drives. The such distribution has advantages and drawbacks:
 If drives fail, they can be re-generated by retrieving data from all other live drives. Hence, the load will be uniformly distributed to all live drives that results in a low rebuild time.
 Erasure codes' parameters (k, m) can be chosen flexibly as long as n≤N.
 Groups of different parameters (k, m) can be co-located in servers without any constraint.
 A drawback is that any failure of more than m drives makes probably some extent groups having more than m lost extents. Hence, lost extents of such groups can un-recoverable from other live ones.

We investigate the case where there are failed drives that leads to some extent groups having lost extents. We introduce two following definitions.

Definition 2 (exposure level): exposure level of an extent group is the number of its lost extents. Exposure level of the server (or exposure level for short), denoted by e, is the maximum of exposure level of all its extent groups.

Definition 3 (tolerance level): tolerance level of an extent group is the number of lost extents it can tolerate. Tolerance level of the server (or tolerance level for short), denoted by r, is the maximum of tolerance level of all its extent groups.

We suppose that the number of extent groups is much larger than the number of drives. Hence, any failure of f drives results to an exposure level e=f. If all extent groups have a same parameter m (note k can be different), the exposure and tolerance level are exchangeable due to e+r=m. In cases of different m, the tolerance level is more important than the exposure level. For example of a server with two different parameters m∈{1, 2}, if a drive fails, exposure level is only 1, but tolerance level is 0, i.e. cannot tolerate more drive failures even if some groups can tolerate one more failure (these of m=2). Therefore, we use the following rebuild policy focusing on the tolerance level:

Rebuild policy: supposing that there are some drive failures, the failed drives are rebuilt by the following policy:

Step 1: find the failed drive containing largest number of groups of lowest tolerance level $\tau_0$. If $\tau_0<0$, the rebuild process stops with some lost extents un-recoverable.

Step 2: repair all groups of tolerance level $\tau_0$ attached to the chosen drive. Re-constructed extents will be either written to a new drive or distributed uniformly to live drives.

Step 3: if all drives are totally rebuilt, the rebuild process successfully ends. Otherwise, return Step 1.

Note, there is also a straightforward rebuild policy that repair sequentially drive-by-drive, and in each drive the rebuild proceeds extent-by-extent. But this rebuild could lead to lower durability since it does not push the server to a higher tolerance level as fast as our rebuild policy does.

Description of ECS

ECS performs operations on sectors inside each extent. As mentioned in the beginning of the document, an extent is composed of two partitions: data and parity partitions. However, as the extent size is usually very large compared to the sector size, each partition is segmented logically into a sequence of continuous sub-partitions of the same size. Each data sub-partition contains $k_s$ sectors that are reserved to stored data fragments. A parity sub-partition contains $m_s$ sectors that store parity information of the data sub-partition. A [$k_s,m_s$] ECS applies on each pair of data and parity sub-partitions.

1. ECS Construction.

An important point is to choose values for ($k_s$, $m_s$) in order to obtain a good trade-off between storage efficiency and computation efficiency. Moreover, the distribution of sector failures is also important. Bad sectors occur at random or together as a burst. By taking into account the two points, we construct a systematic ECS by creating its PCM that is composed of the [$m_s \times m_s$] identity matrix. If $k_s$ is not multiple of $m_s$, the last $$\left(k_S - \left\lfloor \frac{k_S}{m_s} \right\rfloor m_S\right)$$

columns of the data part of PCM is the first $$\left(k_S - \left\lfloor \frac{k_S}{m_s} \right\rfloor m_S\right)$$

columns or the [$m_s \times m_s$] identity matrix. The constructed ECS allows recovering any single burst of at most $m_s$ sectors occurring in each pair of data and parity sub-partitions.

2. Encoding Process.

The encoding process generates all parity sectors for each pair of data and parity sub-partitions. Due to all such pair of sub-partitions use a same ECS, the encoding process can be executed in parallel in order to increase throughput performance.

For each pair of sub-partitions, we index data and parity sectors from 0 to $k_s$ and $m_s$, respectively. The ith parity sector is computed by XORing data sectors of indices (i+$m_s \times$j) for j=0, 1, . . . . The parity sector and such data sectors are associated to the ith row of the PCM.

3. Repair Process.

The repair process is similar as the encoding process. Note, each sector associated to a row of the PCM. To repair a lost sector, if its associated row contains only one lost sector, the lost sector will be recovered by XORing all others sectors associated to the row. If the row contains more than one lost sectors, the lost sectors cannot be recovered by ECS.

The invention claimed is:

1. A method for ensuring recovery of data while conserving server processing and/or storage resources, comprising:
 a) fragmenting data of an object to be stored into an object storage system into multiple data fragments and performing a first error correction encoding process on the data to generate one or more parity fragments for the object;
 b) sending the multiple data fragments and the one or more parity fragments over a network to different storage servers of the object storage system;
 c) performing the following at each of the different storage servers:
  i) incorporating the received one of the multiple data fragments and one or more parity fragments into an extent comprising multiple fragments of other objects;
  ii) performing a second error correction encoding process on multiple extents including the extent to generate parity information for the multiple extents; and,
  iii) storing the multiple extents and the parity information.

2. The method of claim 1 wherein the parity information comprises one or more parity extents of same size.

3. The method of claim 2 wherein the multiple extents and the parity extents are stored on different respective storage devices within their respective storage server.

4. The method of claim 1 wherein the multiple extents are stored on different respective storage devices within their respective storage server.

5. The method of claim 1 wherein the first and second error correction encoding processes are maximum distance separable (MDS) error correction encoding processes.

6. The method of claim 1 wherein the method further comprises performing a third error correction encoding process for each of the multiple extents to generate respective parity information for each of the multiple extents and storing the respective parity information.

7. The method of claim 6 further comprising:
 a) in response to a data item for the object being corrupted, attempting to recover the data item with the respective parity information from the third error correction encoding process generated for the extent; and,
 b) in response to the data item not being recovered from a), attempting to recover the data item with the parity information from the second error correction encoding process and at least some of the multiple extents and parity information.

8. The method of claim 7 further comprising:
in response to the lost information not being recovered, attempting to recover the lost information with at least some of the multiple data fragments and the one or more parity fragments.

9. The method of claim 1 further comprising:
a) in response to a data item for the object being corrupted, attempting to recover the data item with the parity information from the second error correction encoding process and at least some of the multiple extents and parity information;
b) in response to the lost information not being recovered, attempting to recover the lost information with at least some of the multiple data fragments and the one or more parity fragments.

10. The method of claim 1 further comprising changing parity coverage of the second encoding process at at least one of the servers in view of conditions observed at the at least one of the one servers.

11. A method for ensuring recovery of data while conserving storage and/or processing resources of multiple storage entities, comprising:
a) fragmenting data of an object for storage into an object storage system into multiple data fragments and performing a first error correction encoding process on the data to generate one or more parity fragments for the object;
b) sending the multiple data fragments and the one or more parity fragments over a network to different storage entities of the object storage system, where, at least one of the different storage entities is a cloud storage service that is coupled to the network; and,
c) in response to a failed attempt to cure a corruption of one of the fragments locally by its corresponding one of the different storage entities, reading the multiple data fragments and the one or more parity fragments from the different storage entities, sending the multiple data fragments and the one or more parity fragments over the network, and processing the multiple data fragments and the one or more parity fragments to cure the corruption.

12. One or more machine readable storage media, and not transitory propagating signals, having stored thereon program code instructions that when executed by multiple computing systems cause a method for ensuring recovery of data while conserving server processing and/or storage resources to be performed, the method comprising:
a) fragmenting data of an object for storage into an object storage system into multiple data fragments and performing a first error correction encoding process on the data to generate one or more parity fragments for the object;
b) sending the multiple data fragments and the one or more parity fragments over a network to different storage servers of the object storage system;
c) performing the following at each of the different storage servers:
i) incorporating the received one of the multiple data fragments and one or more parity fragments into an extent comprising multiple fragments of other objects;
ii) performing a second error correction encoding process on multiple extents including the extent to generate parity information for the multiple extents; and,
iii) storing the multiple extents and the parity information.

13. The one or more machine readable storage media of claim 12 wherein the parity information comprises one or more parity extents of same size.

14. The one or more machine readable storage media of claim 13 wherein the multiple extents and the parity extents are stored on different respective storage devices within their respective storage server.

15. The one or more machine readable storage media of claim 12 wherein the multiple extents are stored on different respective storage devices within their respective storage server.

16. The one or more machine readable storage media of claim 12 wherein the first and second error correction encoding processes are maximum distance separable (MDS) error correction encoding processes.

17. The one or more machine readable storage media of claim 12 wherein the method further comprises performing a third error correction encoding process for each of the multiple extents to generate respective parity information for each of the multiple extents and storing the respective parity information.

18. The one or more machine readable storage media of claim 17 wherein the method further comprises:
a) in response to a data item for the object being corrupted, attempting to recover the data item with the respective parity information from the third error correction encoding process generated for the extent; and,
b) in response to the data item not being recovered from a), attempting to recover the data item with the parity information from the second error correction encoding process and at least some of the multiple extents and parity information.

19. The one or more machine readable storage media method of claim 18 wherein the method further comprises:
in response to the lost information not being recovered, attempting to recover the lost information with at least some of the multiple data fragments and the one or more parity fragments.

20. The one or more machine readable storage media of claim 12 further comprising:
a) in response to a data item for the object being corrupted, attempting to recover the data item with the parity information from the second error correction encoding process and at least some of the multiple extents and parity information;
b) in response to the lost information not being recovered, attempting to recover the lost information with at least some of the multiple data fragments and the one or more parity fragments.

21. The one or more machine readable storage media of claim 12 wherein the object storage system comprises a distributed hash table storage ring.

22. One or more machine readable storage media, and not transitory propagating signals, having stored thereon program code instructions that when executed by multiple computing systems cause a method for ensuring recovery of data while conserving storage and/or processing resources of multiple storage entities to be performed, the method comprising:
a) fragmenting data of an object for storage into an object storage system into multiple data fragments and performing a first error correction encoding process on the data to generate one or more parity fragments for the object;
b) sending the multiple data fragments and the one or more parity fragments over a network to different storage entities of the object storage system, where, at least one of the different storage entities is a cloud storage service that is coupled to the network; and, c) in response to a failed attempt to cure a corruption of one of the fragments locally by its corresponding one of the different storage entities, reading the multiple data fragments and the one or more parity fragments from the different storage entities, sending the multiple data fragments and the one or more parity fragments over the network, and processing the multiple data fragments and the one or more parity fragments to cure the corruption.

* * * * *